(12) United States Patent
Kwon

(10) Patent No.: US 10,573,679 B2
(45) Date of Patent: Feb. 25, 2020

(54) STACKED CMOS IMAGE SENSOR

(71) Applicant: Samsung Electronics Co., Ltd., Suwon-si, Gyeonggi-do (KR)

(72) Inventor: Doo-won Kwon, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 14 days.

(21) Appl. No.: 16/001,461

(22) Filed: Jun. 6, 2018

(65) Prior Publication Data

US 2019/0123088 A1 Apr. 25, 2019

(30) Foreign Application Priority Data

Oct. 24, 2017 (KR) .................. 10-2017-0138462

(51) Int. Cl.
*H01L 27/146* (2006.01)
*H01L 23/522* (2006.01)
(Continued)

(52) U.S. Cl.
CPC .... *H01L 27/14634* (2013.01); *H01L 23/5223* (2013.01); *H01L 24/92* (2013.01); *H01L 25/0657* (2013.01); *H01L 27/14636* (2013.01); *H01L 24/03* (2013.01); *H01L 24/05* (2013.01); *H01L 24/08* (2013.01); *H01L 24/13* (2013.01);
(Continued)

(58) Field of Classification Search
CPC ........... H01L 27/14634; H01L 23/5223; H01L 27/14636; H01L 2224/05147; H01L 24/05; H01L 24/92; H01L 2224/80447; H01L 24/03; H01L 24/08; H01L 24/13; H01L 24/16; H01L 24/80; H01L 24/94; H01L 2224/0401; H01L 2224/05546; H01L 2224/05647; H01L 2224/08145; H01L 2224/08146; H01L 2224/16145; H01L 2224/16146; H01L 2224/80895; H01L 2224/80896; H01L 2224/9202; H01L 2224/94; H01L 2224/80203; H01L 2224/03616; H01L 27/14643; H01L 2924/00; H01L 27/146; H01L 27/1464; H01L 25/0657
See application file for complete search history.

(56) References Cited

U.S. PATENT DOCUMENTS 7,847,847 B2 12/2010 Yaung et al.
8,792,034 B2 7/2014 Takahashi
(Continued)

*Primary Examiner* — Steven H Loke
*Assistant Examiner* — Samuel Park
(74) *Attorney, Agent, or Firm* — Myers Bigel, P.A.

(57) ABSTRACT

A stacked complementary metal oxide semiconductor (CMOS) image sensor includes: a first semiconductor chip in which a plurality of pixels are in an upper area in a two-dimensional array structure and a first wiring layer is in a lower area; and a second semiconductor chip in which a second wiring layer is arranged in an upper area and logic elements are in a lower area, wherein the first semiconductor chip is coupled to the second semiconductor chip through a connection between a first metal pad in a first pad insulating layer in a lowermost portion of the first wiring layer and a second metal pad in a second pad insulating layer in an uppermost portion of the second wiring layer, and wherein a metal-insulator-metal (MIM) capacitor is in at least one of the first pad insulating layer and the second pad insulating layer.

16 Claims, 17 Drawing Sheets

(51) Int. Cl.
*H01L 25/065* (2006.01)
*H01L 23/00* (2006.01)

(52) U.S. Cl.
CPC .............. *H01L 24/16* (2013.01); *H01L 24/80* (2013.01); *H01L 24/94* (2013.01); *H01L 2224/03616* (2013.01); *H01L 2224/0401* (2013.01); *H01L 2224/05147* (2013.01); *H01L 2224/05546* (2013.01); *H01L 2224/05647* (2013.01); *H01L 2224/08145* (2013.01); *H01L 2224/08146* (2013.01); *H01L 2224/16145* (2013.01); *H01L 2224/16146* (2013.01); *H01L 2224/80203* (2013.01); *H01L 2224/80447* (2013.01); *H01L 2224/80895* (2013.01); *H01L 2224/80896* (2013.01); *H01L 2224/9202* (2013.01); *H01L 2224/94* (2013.01)

(56) References Cited

U.S. PATENT DOCUMENTS

| | | | |
|---|---|---|---|
| 8,957,358 B2 | 2/2015 | Wan et al. | |
| 9,165,974 B2 | 10/2015 | Kim et al. | |
| 9,337,228 B2 | 5/2016 | Sa et al. | |
| 9,450,010 B2 | 9/2016 | Kashihara | |
| 9,559,130 B2 | 1/2017 | Chao et al. | |
| 9,613,994 B2 | 4/2017 | Yamashita | |
| 2005/0057389 A1* | 3/2005 | Krymski | H03K 4/026 341/169 |
| 2009/0309186 A1* | 12/2009 | Inoue | H01L 23/5223 257/532 |
| 2015/0091124 A1 | 4/2015 | Liu et al. | |
| 2016/0020235 A1* | 1/2016 | Yamashita | H01L 27/14609 250/208.1 |
| 2016/0190198 A1 | 6/2016 | Kwon et al. | |
| 2017/0092680 A1 | 3/2017 | Kwon | |

* cited by examiner

STACKED CMOS IMAGE SENSOR

CROSS-REFERENCE TO RELATED APPLICATION

This application claims the benefit of Korean Patent Application No. 10-2017-0138462, filed on Oct. 24, 2017, in the Korean Intellectual Property Office, the disclosure of which is incorporated herein in its entirety by reference.

BACKGROUND

Embodiments of the inventive concept of the present disclosure relate to an image sensor, and more particularly, to a stacked complementary metal oxide semiconductor (CMOS) image sensor having a structure in which at least two semiconductor chips are combined.

In general, a CMOS image sensor (CIS) may include a pixel area and a logic area. In the pixel area, a plurality of pixels may be arranged in a two-dimensional array structure, and each of unit pixels constituting the pixels may include one photodiode and a plurality of pixel transistors. The pixel transistors may include, for example, a transfer transistor, a reset transistor, a source follower transistor, and a selection transistor. In the logic area, logic elements for processing pixel signals from the pixel area may be arranged. A CIS may have a structure in which a pixel area and a logic area are formed in respective chips and the two chips, i.e., the respective chips, may be stacked in some examples. A CIS having a stacked structure may provide high image quality through maximization of the number of pixels in the pixel area and may contribute to optimization of the performance of logic elements in the logic area.

SUMMARY

The inventive concept provides a stacked complementary metal oxide semiconductor (CMOS) image sensor (CIS) which improves the layout freedom of a metal-insulator-metal (MIM) capacitor and facilitates the formation of the MIM capacitor in manufacturing processes.

According to an aspect of the inventive concept, there is provided a stacked complementary metal oxide semiconductor (CMOS) image sensor including: a first semiconductor chip in which a plurality of pixels are in an upper area of the first semiconductor chip in a two-dimensional array structure and a first wiring layer is in a lower area of the first semiconductor chip; and a second semiconductor chip in which a second wiring layer is in an upper area of the second semiconductor chip and logic elements are in a lower area of the second semiconductor chip, wherein the first semiconductor chip is coupled to the second semiconductor chip through a connection between a first metal pad in a first pad insulating layer in a lowermost portion of the first wiring layer and a second metal pad in a second pad insulating layer in an uppermost portion of the second wiring layer, and wherein a metal-insulator-metal (MIM) capacitor is in at least one of the first pad insulating layer and the second pad insulating layer.

According to another aspect of the inventive concept, there is provided a stacked complementary metal oxide semiconductor (CMOS) image sensor including: a pixel chip including a pixel area containing a plurality of pixels and a pixel peripheral area surrounding the pixel area; and a logic chip under the pixel chip, the logic chip including logic elements, wherein the pixel chip and the logic chip are coupled to each other through copper (Cu)—Cu bonding, wherein a metal-insulator-metal (MIM) capacitor is in at least one of a first insulating layer including a first Cu pad of the pixel chip and a second insulating layer including a second Cu pad of the logic chip, the first Cu pad and the second Cu pad being used for the Cu—Cu bonding.

According to another aspect of the inventive concept, there is provided a stacked complementary metal oxide semiconductor (CMOS) image sensor including: a pixel chip including a pixel area containing a plurality of pixels and a pixel peripheral area surrounding the pixel area; a logic chip under the pixel chip, the logic chip including logic elements; and a memory chip under the logic chip, the memory chip including memory elements, wherein the logic chip and the pixel chip are coupled to each other through metal-to-metal bonding, wherein a metal-insulator-metal (MIM) capacitor is in at least one of a first insulating layer including a first metal pad of the logic chip and a second insulating layer including a second metal pad of the pixel chip, the first metal pad and the second metal pad being used for metal-to-metal bonding.

It is noted that aspects described with respect to one embodiment may be incorporated in different embodiments although not specifically described relative thereto. That is, all embodiments and/or features of any embodiments can be combined in any way and/or combination. Moreover, other methods, systems, devices and/or circuits according to embodiments of the inventive concept will be or become apparent to one with skill in the art upon review of the following drawings and detailed description. It is intended that all such additional methods, systems, devices and/or circuits be included within this description, be within the scope of the present inventive concept, and be protected by the accompanying claims. It is further intended that all embodiments disclosed herein can be implemented separately or combined in any way and/or combination.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1A:
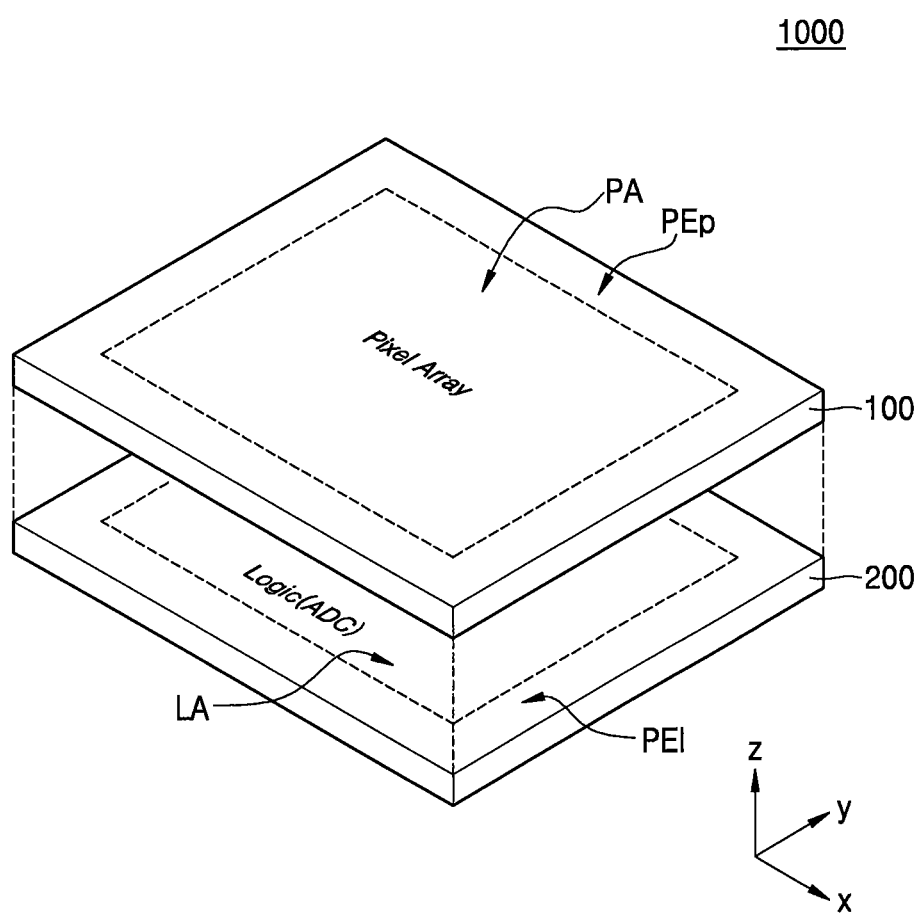
FIGS. 1A and 1B are views illustrating a stacked complementary metal oxide semiconductor (CMOS) image sensor (CIS) according to some embodiments of the inventive concept.

Hereinafter, embodiments of the inventive concept will be described in detail with reference to the accompanying drawings. Like reference numerals denote like elements in the drawings, and redundant descriptions thereof will be omitted.

Figure 1B:
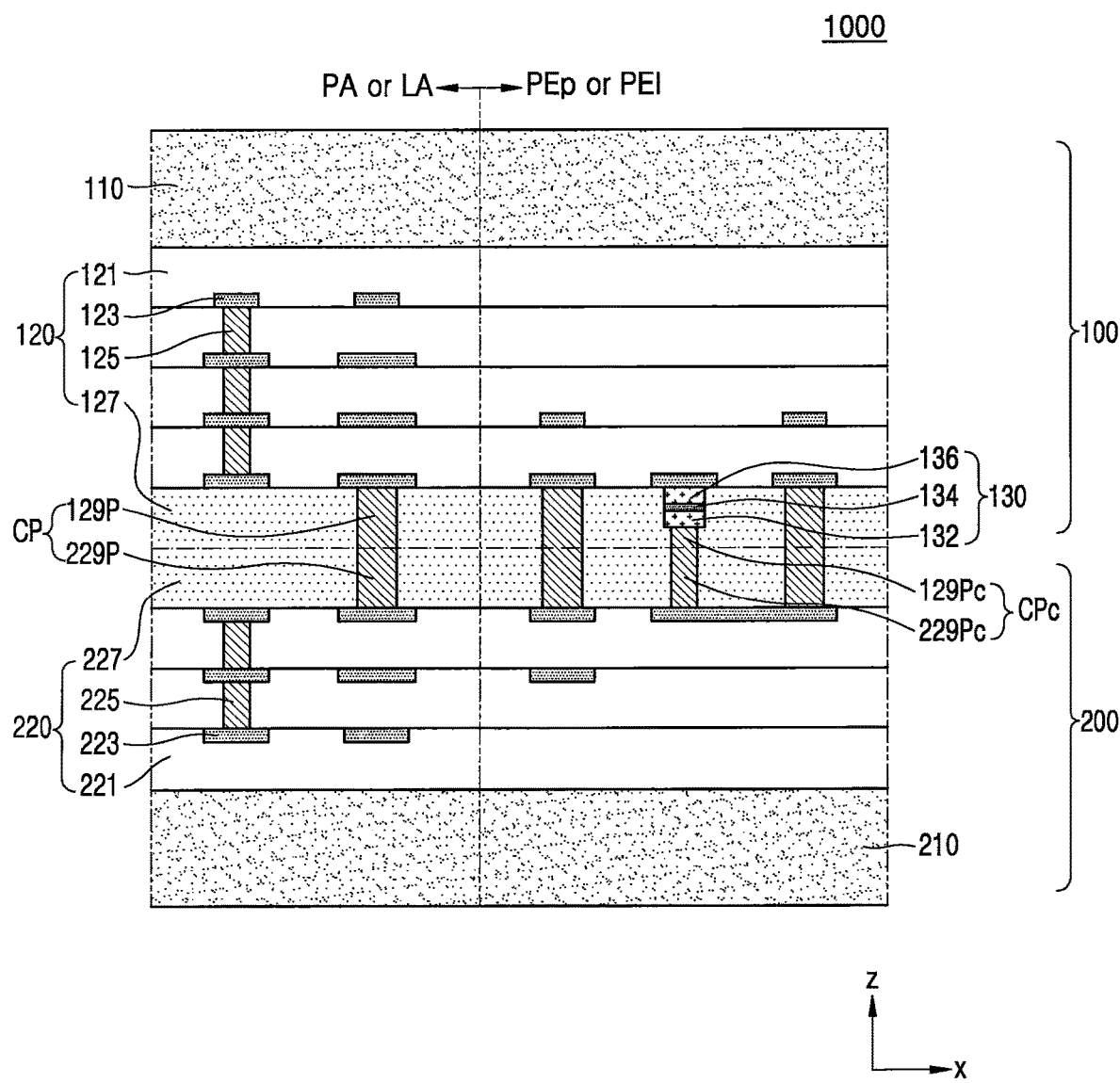

Stack type CMOS image sensors may incorporate metal-insulator-metal (MIM) in interlayer insulating layers used to isolate wiring lines, vertical contacts, and the like. As a result, it may be more difficult to design the layout of an MIM capacitor in the interlayer insulating layers because of the presence of these additional structures. Moreover, the interlayer insulating layers are typically relatively thin, making it difficult to form MIM capacitors that may have relatively large sizes. Some embodiments of the present inventive concept stem from a realization that a MIM capacitor may be formed in a contact pad insulating layer. The contact pad insulating layer may be relatively thick as compared to the interlayer insulating layers used between wiring lines and vertical contacts. As a result, larger MIM capacitors may be more easily formed therein. Moreover, there may be fewer structures in the contact pad insulating layer increasing the degree of freedom with respect to a design layout for a MIM capacitor in the contact pad insulating layer. FIGS. 1A and 1B are views illustrating a stacked complementary metal oxide semiconductor (CMOS) image sensor (CIS) 1000 according to an embodiment of the inventive concept. FIG. 1A is an exploded perspective view in which a first semiconductor chip 100 in which pixels are arranged and a second semiconductor chip 200 in which logic elements are arranged are separated, and FIG. 1B is a cross-sectional view illustrating a main part of a structure in which the first semiconductor chip 100 is coupled to the second semiconductor chip 200.

Referring to FIGS. 1A and 1B, the stacked CIS 1000, according to some embodiments of the present inventive concept, may include the first semiconductor chip 100 and the second semiconductor chip 200, and may have a structure in which the first semiconductor chip 100 is stacked on the second semiconductor chip 200.

The first semiconductor chip 100 may include a pixel area PA and a pixel peripheral area PEp. The pixel area PA may be arranged in the central area of the first semiconductor chip 100, and a plurality of pixels may be arranged in a two-dimensional array structure in the pixel area PA. The pixel peripheral area PEp may be arranged at the periphery of the pixel area PA with a structure surrounding the pixel area PA, and wiring lines for electrical connection with the second semiconductor chip 200 may be arranged in the pixel peripheral area PEp.

As shown in FIG. 1B, in view of a vertical structure along a third direction (z direction), a first semiconductor substrate 110 may be positioned in the upper portion of the first semiconductor chip 100 and a first wiring layer 120 may be positioned in the lower portion of the first semiconductor chip 100. Pixels may be formed in the first semiconductor substrate 110. The structure of the pixels formed in the first semiconductor substrate 110 will be described in more detail with reference to FIGS. 2A and 2B.

The first wiring layer 120 may include first interlayer insulating layers 121, first wiring lines 123, first vertical contacts 125, and a first pad insulating layer 127. The first vertical contacts 125 may electrically connect the first wiring lines 123 to each other or electrically connect the first wiring lines 123 to the first semiconductor substrate 110. The first pad insulating layer 127 may be an insulating layer in which a first copper (Cu) pad 129P is arranged, and will be described in more detail in the description of 'Cu—Cu bonding' below.

Although not shown, color filters and microlenses may be formed in the upper portion of the first semiconductor substrate 110. A structure in which color filters and microlenses are formed in the direction opposite to that of the first wiring layer 120, with respect to the first semiconductor substrate 110 in which pixels are formed, is referred to as a Back Side Illumination (BSI) structure. Conversely, a structure in which color filters and microlenses are formed in the same direction as the first wiring layer 120, with respect to the first semiconductor substrate 110, that is, a structure in which color filters and microlenses are formed on the first wiring layer 120, is referred to as a Front Side Illumination (FSI) structure.

In the structure of the stacked CIS 1000 of FIG. 1A, the pixel peripheral area PEp is arranged on all of the four sides of the first semiconductor chip 100. However, the pixel peripheral area PEp is not limited thereto in accordance with other embodiments of the inventive concept. For example, the pixel peripheral area PEp may not be formed on at least one of the four sides of the first semiconductor chip 100.

The second semiconductor chip 200 may include a logic area LA and a logic peripheral area PEl. The logic area LA may be arranged in the central area of the second semiconductor chip 200, and a plurality of logic elements may be arranged in the logic area LA. The logic elements may include various circuits for processing pixel signals from the pixels of the first semiconductor chip 100. For example, the logic elements may include an analog signal processing circuit, an analog-to-digital converter (ADC) circuit, an image signal processing circuit, a control circuit, and the like. However, circuits included in the logic elements are not limited to thereto in accordance with other embodiments of the inventive concept. The logic peripheral area PE1 is arranged on the periphery of the logic area LA to have a structure surrounding the logic area LA, and wiring lines for electrical connection with the first semiconductor chip 100 may be arranged in the logic peripheral area PE1. The logic peripheral area PE1 may also be arranged on all of the four or more sides of the second semiconductor chip 200. However, the logic peripheral area PEl is not limited thereto, and, for example, the logic peripheral area PEl may not be formed on at least one of the four sides of the second semiconductor chip 200.

As shown in FIG. 1B, in view of a vertical structure along the third direction (z direction), a second semiconductor substrate 210 may be positioned in the lower portion of the second semiconductor chip 200 and a second wiring layer 220 may be positioned in the upper portion of the second semiconductor chip 200. Transistors of logic elements may be formed in the second semiconductor substrate 210. The second wiring layer 220 may include second interlayer insulating layers 221, second wiring lines 223, second vertical contacts 225, and a second pad insulating layer 227. The second vertical contacts 225 may electrically connect the second wiring lines 223 to each other or electrically connect the second wiring lines 223 to the second semiconductor substrate 210. The second pad insulating layer 227 may be an insulating layer in which a second Cu pad 229P is arranged, and will be described in more detail in the description of 'Cu—Cu bonding' below.

According to some embodiments, the second semiconductor chip 200 may further include a memory area. Memory elements may be arranged in the memory area. For example, the memory elements may include Dynamic Random Access Memory (DRAM) modules and/or Magnetic Random Access Memory (MRAM) modules. Accordingly, a plurality of DRAM cells and/or a plurality of MRAM cells may be arranged in a two-dimensional array structure in the memory area. On the other hand, when the second semiconductor chip 200 includes a memory area, memory elements of the memory area may be formed together with logic elements of the logic area. For example, the logic elements of the logic area and the memory elements of the memory area may be formed together through a CMOS process. The memory elements may be used as an image buffer memory for storing a frame image.

As shown in FIG. 1B, the second semiconductor chip 200 may be arranged under the first semiconductor chip 100 and be coupled to the first semiconductor chip 100. That is, the first semiconductor chip 100 and the second semiconductor chip 200 may be coupled to each other, such that a lower surface of the first wiring layer 120 of the first semiconductor chip 100 faces an upper surface of the second wiring layer 220 of the second semiconductor chip 200. The coupling of the first semiconductor chip 100 and the second semiconductor chip 200 may be made through metal-to-metal bonding. In this case, the metal may be, for example, Cu. However, the metal is not limited to Cu in other embodiments of the inventive concept.

Because the first semiconductor chip 100 and the second semiconductor chip 200 are coupled to each other through Cu—Cu bonding, the first semiconductor chip 100 and the second semiconductor chip 200 may be electrically connected to each other via a Cu pad CP. Accordingly, pixel signals from the first semiconductor chip 100 may be transferred to the logic elements of the logic area LA of the second semiconductor chip 200.

More specifically, in the first semiconductor chip 100, the first Cu pad 129P may be formed in the first pad insulating layer 127 in the lowermost portion of the first wiring layer 120 in the third direction (z direction). The first Cu pad 129P may be electrically connected to any one of the first wiring lines 123 of the first wiring layer 120 through the first pad insulating layer 127 and may be exposed on the lower surface of the first pad insulating layer 127. The first pad insulating layer 127 may include silicon oxide, silicon nitride, silicon oxynitride, or the like. However, the material of the first pad insulating layer 127 is not limited thereto in accordance with other embodiments of the inventive concept.

Because the first Cu pad 129P is formed on the lower portion of the first semiconductor chip 100, the first Cu pad 129P may not affect pixels of the pixel area PA formed on the upper portion of the first semiconductor chip 100. Accordingly, the first Cu pad 129P may be formed throughout the pixel area PA and the pixel peripheral area PEp of the first semiconductor chip 100 regardless of the pixels. However, according to some embodiments, the first Cu pad 129P may be arranged only in the pixel peripheral area PEp.

In the first semiconductor chip 200, the second Cu pad 229P may be formed in the second pad insulating layer 227 in the uppermost portion of the second wiring layer 220 in the third direction (z direction). The second Cu pad 229P may be electrically connected to any one of the second wiring lines 223 of the second wiring layer 220 through the second pad insulating layer 227 and may be exposed on the upper surface of the second pad insulating layer 227. The second pad insulating layer 227 may also include silicon oxide, silicon nitride, silicon oxynitride, or the like.

The first Cu pad 129P and the second Cu pad 229P are separately formed in the first semiconductor chip 100 and the second semiconductor chip 200, respectively, and when the first semiconductor chip 100 and the second semiconductor chip 200 are coupled to each other, the first Cu pad 129P and the second Cu pad 229P may be electrically connected to each other. For example, by aligning the first semiconductor chip 100 and the second semiconductor chip 200, such that the first Cu pad 129P and the second Cu pad 229P corresponding thereto face each other, and by performing compression bonding and heat treatment, the first Cu pad 129P and the second Cu pad 229P may be electrically connected to each other. In addition, the first Cu pad 129P and the second Cu pad 229P may be coupled to each other to thereby form a one-body or monolithic type Cu pad CP.

A process of coupling a Cu pad and another Cu pad together is referred to as a Cu—Cu bonding process or a Cu—Cu direct bonding process. In addition, because the first pad insulating layer 127 and the second pad insulating layer 227 are also coupled together in the Cu—Cu bonding process, the process of coupling a Cu pad and another Cu pad together is also referred to as a Cu—Cu hybrid bonding process.

In FIG. 1B, a dashed line in a first direction (x direction) represents a boundary at which the first semiconductor chip 100 and the second semiconductor chip 200 are coupled to each other. Like the Cu pad CP, the first pad insulating layer 127 and the second pad insulating layer 227 may form an integrated structure after being coupled. The stacking and coupling of the first semiconductor chip 100 and the second semiconductor chip 200 through the Cu—Cu bonding process may be performed at a wafer level. For example, a first wafer including first semiconductor chips 100 and a second wafer including second semiconductor chips 200 may be coupled to each other and then separated into a plurality of stacked chip structures through a sawing process or the like. Each of the plurality of stacked chip structures may have a two-layer structure including a first semiconductor chip 100 and a second semiconductor chip 200. However, the implementation of the stacked CIS 1000, according to some embodiments of the inventive concept, is not limited to the wafer level stacking and coupling. For example, the implementation of the stacked CIS 1000 may be achieved by stacking and coupling at a chip level in other embodiments of the inventive concept.

In the stacked CIS 1000 according to some embodiments illustrated in FIG. 1B, a metal-insulator-metal (MIM) capacitor 130 may be formed in the first pad insulating layer 127. For example, the MIM capacitor 130 may be arranged within the first pad insulating layer 127 and arranged between a first wiring line 123 on the MIM capacitor 130 and a cap Cu pad CPc under the MIM capacitor 130. The MIM capacitor 130 may also be electrically connected to an adjacent Cu pad CP through a second wiring line 223 connected to the cap Cu pad CPc.

The cap Cu pad CPc may be formed by the coupling of a first cap Cu pad 129Pc of the first pad insulating layer 127 and a second cap Cu pad 229Pc of the second pad insulating layer 227, similar to the Cu pad CP. In this case, 'cap' in the cap Cu pad CPc denotes that the cap Cu pad CPc is connected to the MIM capacitor 130, and the structure of the cap Cu pad CPc may be substantially the same as that of the Cu pad CP. However, as shown in FIG. 1B, the length of the cap Cu pad CPc in the third direction (z direction) may be less than that of the Cu pad CP in the third direction (z direction) due to the presence of the MIM capacitor 130. In addition, the width of the cap Cu pad CPc in the first direction (x direction) may be less than that of the Cu pad CP in the first direction (x direction). However, according to an embodiment, the width of the cap Cu pad CPc in the first direction (x direction) may be substantially equal to that of the Cu pad CP in the first direction (x direction).

The MIM capacitor 130 may include a lower electrode 132, a dielectric layer 134, and an upper electrode 136. The lower electrode 132 and the upper electrode 136 may include metal. The MIM capacitor 130 may be used for reducing an operating voltage, increasing a supply voltage per core, improving a frequency control function, improving a sampling rate of an analog-to-digital converter (ADC), and the like. Furthermore, the MIM capacitor 130 may be used for improving various signal characteristics in analog/RF integrated circuits. To improve the performance of the MIM capacitor 130, high-k materials, such as $Ta_2O_5$, $Al_2O_3$, and $HfO_2$ may be used as the material of the dielectric layer 134 and a multilayer structure, such as $SHS(SiO_2/HfO_2/SiO_2)$ or $AHA(Al_2O_3/HfO_2/Al_2O_3)$ may be used.

In the stacked CIS 1000 according to some embodiments, the cap Cu pad CPc and the Cu pad CP adjacent thereto may be connected to each other through the second wiring line 223 of the second semiconductor chip 200, and thus, a voltage may be applied to the MIM capacitor 130 through the first wiring lines 123 of the first semiconductor chip 100. For example, voltages may be applied to both ends of the MIM capacitor 130 in such a manner that a positive voltage is applied to a first wiring line 123 connected to the MIM capacitor 130 and a negative voltage is applied to another first wiring line 123 connected to the Cu pad CP.

In the stacked CIS 1000 according to some embodiments, because the MIM capacitor 130 is formed in the first pad insulating layer 127 and is electrically connected to the cap Cu pad CPc, the degree of freedom in layout of the MIM capacitor 130 may be improved. In addition, the MIM capacitor 130 may be relatively easily formed. More specifically, in conventional CISs, an MIM capacitor is formed in any one of the first interlayer insulating layers 121 and there may be a limit on the layout of the MIM capacitor due to the presence of the first wiring lines 123 and the first vertical contacts 125. Also, in general, it may not be easy to form an MIM capacitor having a relatively large size in any one of the first interlayer insulating layers 121 because the first interlayer insulating layers 121 is relatively thin. Furthermore, in conventional CISs, additional wiring lines and/or additional vertical contacts may be formed to apply voltages to the MIM capacitor, and, thus, an additional semiconductor process may be required.

In the stacked CIS 1000 according to some embodiments, the MIM capacitor 130 is arranged in the first pad insulating layer 127 where the first Cu pad 129P is arranged, and, thus, problems occurring in the formation of an MIM capacitor in the conventional CISs may be solved. For example, in the stacked CIS according to some embodiments of the inventive concept, because the first pad insulating layer 127 is relatively thick and there is sufficient space between the Cu pads CP, the degree of freedom of layout of the MIM capacitor 130 is generally high and it may be easier to form the MIM capacitor 130 in the first pad insulating layer 127. Furthermore, because the cap Cu pad CPc connected to the MIM capacitor 130 is formed together with the Cu pads CP, an additional semiconductor process may not be required other than a process of forming the MIM capacitor 130. As a result, the stacked CIS 1000, according to some embodiments of the inventive concept, may simplify semiconductor manufacturing processes and, thus, improve process efficiency and mass productivity.

The stacked CIS 1000, according to some embodiments of the inventive concept, may include a three-dimensional (3D) CIS. The 3D CIS may include a time of flight (TOF) function to enable depth measurement, thereby realizing an object as a stereoscopic 3D result.

Figure 2A:
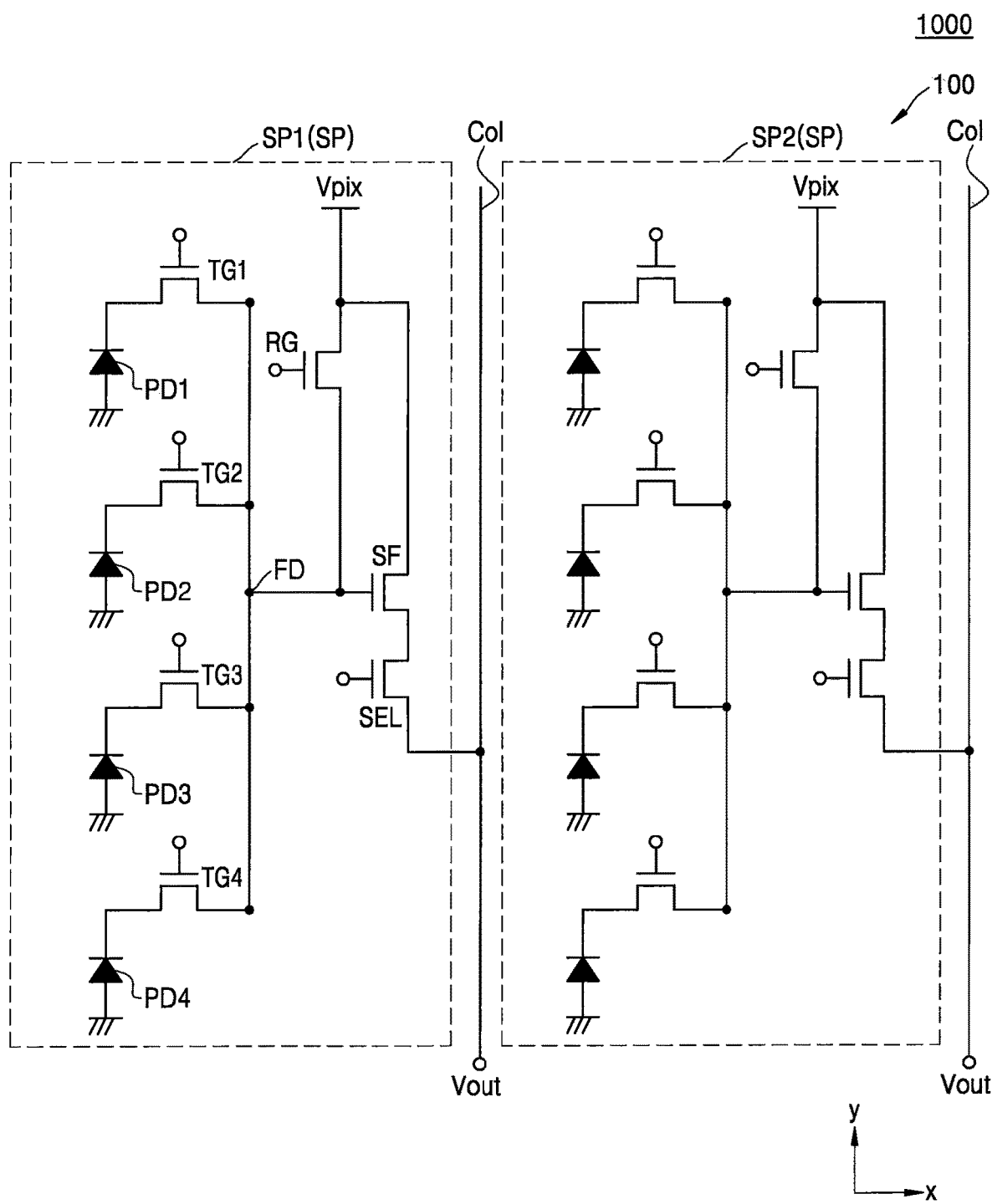
FIGS. 2A and 2B are a circuit diagram and a corresponding schematic plan view of a unit pixel constituting pixels included in a first semiconductor chip in the stacked CIS of FIG. 1A.
Figure 2B:
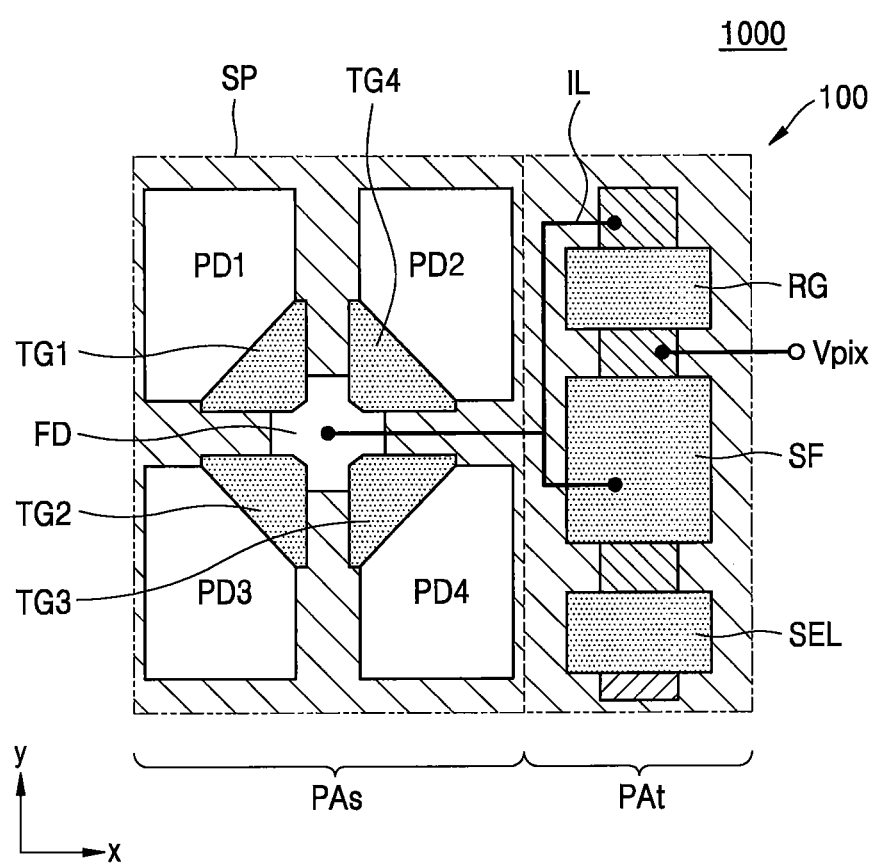

FIGS. 2A and 2B are a circuit diagram and a corresponding schematic plan view, respectively, of a unit pixel constituting pixels included in the first semiconductor chip 100 in the stacked CIS of FIG. 1A.

Referring to FIGS. 2A and 2B, in the stacked CIS 1000, according to some embodiments of the inventive concept, a plurality of shared pixels SP may be arranged in a two-dimensional array structure in the pixel area PA (see FIG. 1A) of the first semiconductor chip 100. Although two shared pixels SP1 and SP2 are shown in FIG. 2A, a plurality of shared pixels SP may be arranged in a two-dimensional array structure in the first direction (x direction) and the second direction (y direction) in the pixel area PA (see FIG. 1A) of the first semiconductor chip 100 in other embodiments of the inventive concept.

Each of the plurality of shared pixels SP may include a pixel sharing area PAs and a transistor area PAt. For example, a photodiode PD, a transfer transistor TG, and a floating diffusion area FD may be arranged in the pixel sharing area PAs, and a reset transistor RG, a source follower transistor SF, and a selection transistor SEL may be arranged in the transistor area PAt.

The photodiode PD may be a P-N junction diode and may generate charges, for example, electrons, which are negative charges, and holes, which are positive charges, in proportion to the amount of incident light. The transfer transistor TG may transfer charges generated in the photodiode PD to the floating diffusion area FD, and the reset transistor RG may periodically reset charges stored in the floating diffusion area FD. The source follower transistor SF may buffer a signal corresponding to the charges charged in the floating diffusion area FD as a buffer amplifier. The selection transistor SEL may select a pixel as a transistor functioning as a switch. A column line Col may be connected to a source area of the selection transistor SEL, and the voltage of the source area of the selection transistor SEL may be output through the column line Col as an output voltage Vout. In the stacked CIS 1000 of the present embodiment, one photodiode PD corresponds to one pixel, and, therefore, unless otherwise described, the photodiode PD and the pixel are treated as the same concept.

As shown in FIG. 2B, four photodiodes PD1 to PD4 may be arranged in one pixel sharing area PAs. Thus, four pixels may constitute one shared pixel SP. For example, the shared pixel SP may have a structure in which four photodiodes PD1 to PD4 surround and share one floating diffusion area FD.

In one shared pixel SP, the sharing of one floating diffusion area FD by the four photodiodes PD1 to PD4 may be realized through four transfer transistors TG1 to TG4 respectively corresponding to the four photodiodes PD1 to PD4, as shown in FIG. 2A. Specifically, the transfer transistor TG1 (a first transfer transistor) corresponding to the photodiode PD1 (a first photodiode), the transfer transistor TG2 (a second transfer transistor) corresponding to the photodiode PD2 (a second photodiode), the transfer transistor TG3 (a third transfer transistor) corresponding to the photodiode PD3 (a third photodiode), and the transfer transistor TG4 (a fourth transfer transistor) corresponding to the photodiode PD4 (a fourth photodiode) may share the floating diffusion area FD as a common drain area.

The concept of the sharing of the shared pixel SP may not only mean that four photodiodes PD1 to PD4 share one floating diffusion area FD but also mean that four photodiodes PD1 to PD4 share pixel transistors (i.e., the reset transistor RG, the source follower transistor SF, and the selection transistor SEL) other than the transfer transistors TG1 to TG4. That is, the four photodiodes PD1 to PD4 constituting the shared pixel SP may share the reset transistor RG, the source follower transistor SF, and the selection transistor SEL. The reset transistor RG, the source follower transistor SF, and the selection transistor SEL may be arranged in a second direction (y direction) in the transistor area PAt. However, the reset transistor RG, the source follower transistor SF, and the selection transistor SEL may be arranged in a first direction (x direction) in the transistor area PAt based on arrangement structures of the photodiodes PD1 to PD4 and the transfer transistors TG1 to TG4 in the pixel sharing area PAs.

Referring to a connection relationship of pixel transistors (i.e., the transfer transistors TG1 to TG4, the reset transistor RG, the source follower transistor SF, and the selection transistor SEL) shown in FIG. 2A, the four photodiodes PD1 to PD4 may form source areas of the four transfer transistors TG1 to TG4 respectively corresponding to the four photodiodes PD1 to PD4. The floating diffusion area FD may form a common drain area of the transfer transistors TG1 to TG4 and may be connected to a source area of the reset transistor RG by a wiring line IL. In addition, the floating diffusion area FD may be connected to a gate electrode of the source follower transistor SF through the wiring line IL. A drain area of the reset transistor RG and a drain area of the source follower transistor SF may be shared and connected to a power source voltage Vpix. A source area of the source follower transistor SF and a drain area of the selection transistor SEL may be shared with each other. An output voltage Vout may be connected to a source area of the selection transistor SF. That is, the voltage of the source area of the selection transistor SEL may be output as the output voltage Vout through the column line Col.

In the stacked CIS 1000 according to some embodiments of the inventive concept, the shared pixel SP may include four pixels of the pixel sharing area PAs and transistors (i.e., the reset transistor RG, the source follower transistor SF, and the selection transistor SEL) of the transistor area PAt corresponding to the pixel sharing area PAs, and the transfer transistors TG1 to TG4 respectively corresponding to the photodiodes PD1 to PD4 may be arranged in the pixel sharing area PAs. Although FIGS. 2A and 2B illustrate example embodiments in which four pixels constitute one shared pixel SP, embodiments of the shared pixel structure of the stacked CIS 1000 are not limited thereto. For example, in the stacked CIS according to some embodiments of the inventive concept, two pixels may constitute one shared pixel, or eight pixels may constitute one shared pixel. Also, according to some embodiments of the inventive concept, single pixels may be arranged in the pixel area PA rather than shared pixels. When single pixels are used, each pixel may include a photodiode PD, a floating diffusion area FD, and pixel transistors (i.e., a transfer transistor TG, a reset transistor RG, a source follower transistor SF, and a selection transistor SEL).

FIGS. 3A to 3D are cross-sectional views of stacked CISs 1000a, 1000b, 1000c, and 1000d according to some embodiments of the inventive concept. The cross-sectional views of FIGS. 3A to 3D correspond to the cross-sectional view of FIG. 1B. The elements already described in the description of FIGS. 1A to 2B are briefly described or omitted.

Figure 3A:
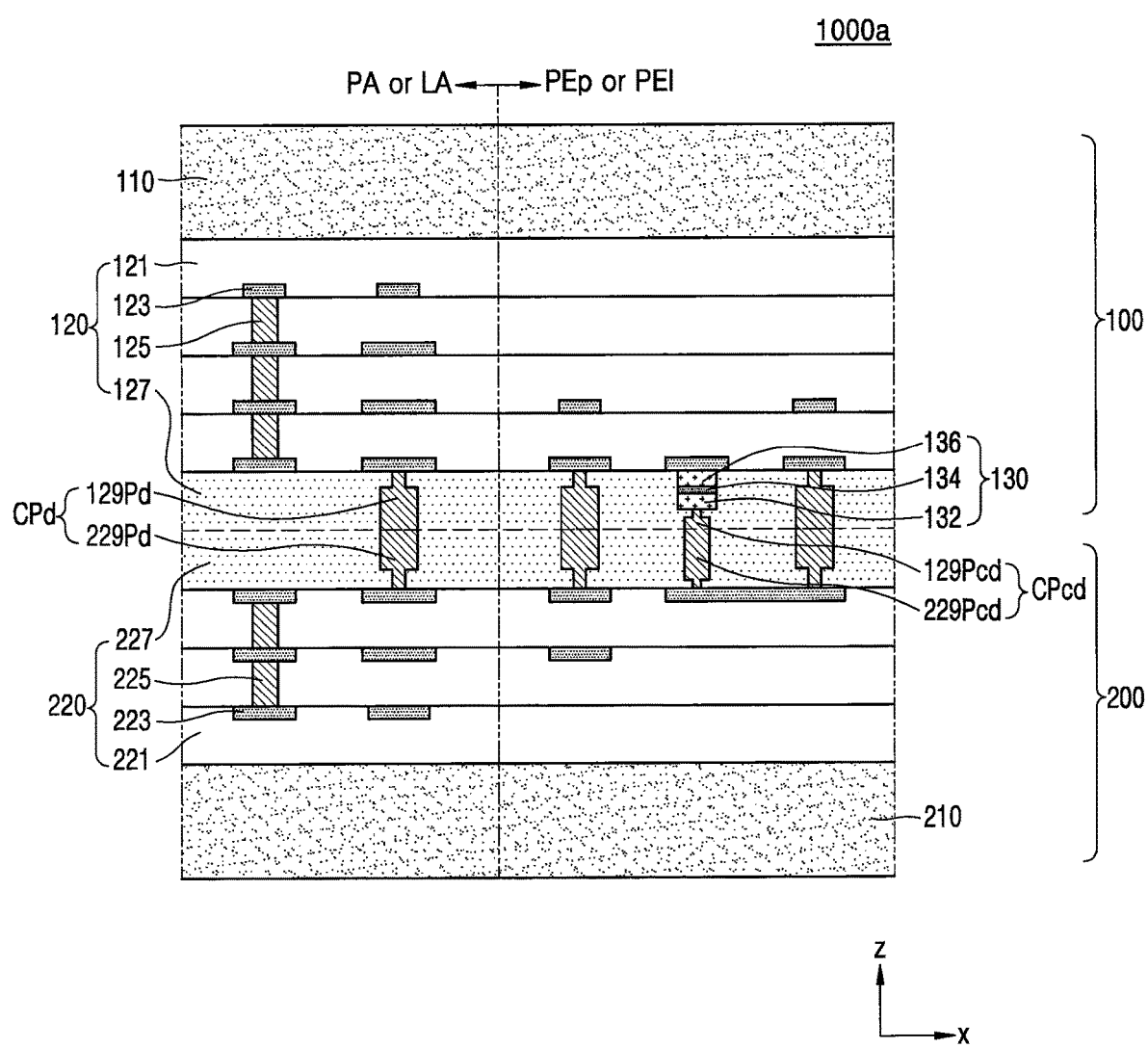
FIGS. 3A to 3D are cross-sectional views of stacked CISs according to some embodiments of the inventive concept.

Referring to FIG. 3A, the structures of a Cu pad CPd and a cap Cu pad CPcd in the stacked CIS 1000a, according to some embodiments of the inventive concept, may be different from the structures of the Cu pad CP and the cap Cu pad CPc in the stacked CIS 1000 of FIG. 1B. More specifically, in the stacked CIS 1000a according to some embodiments of the inventive concept, the Cu pad CPd may be formed by the coupling of a first Cu pad 129Pd and a second Cu pad 229Pd respectively formed as a dual Damascene structure. A Damascene process may denote a process of forming a trench in a dielectric layer and filling the trench with metal to form a wiring line, and may generally be used to form a Cu wiring line, which may be difficult to pattern. In addition, a single Damascene process may denote forming a trench once to thereby form a Cu wiring line with the same width, and a dual damascene process may denote forming a trench twice to thereby form a Cu wiring line having lower and upper widths different from each other.

In the stacked CIS 1000a according to some embodiments of the inventive concept, the cap Cu pad CPcd may be formed together with the Cu pad CPd. Accordingly, the cap Cu pad CPcd may also be formed by a coupling of a first cap Cu pad 129Pcd and a second cap Cu pad 229Pcd respectively formed as a dual Damascene structure. In the stacked CIS 1000 of FIG. 1B, the Cu pad CP may be formed through the coupling of the first Cu pad 129P and the second Cu pad 229P respectively formed by a single Damascene process, and the cap Cu pad CPc may be formed through the coupling of the first cap Cu pad 129Pc and the second cap Cu pad 229Pc respectively formed by a single Damascene process.

Figure 3B:
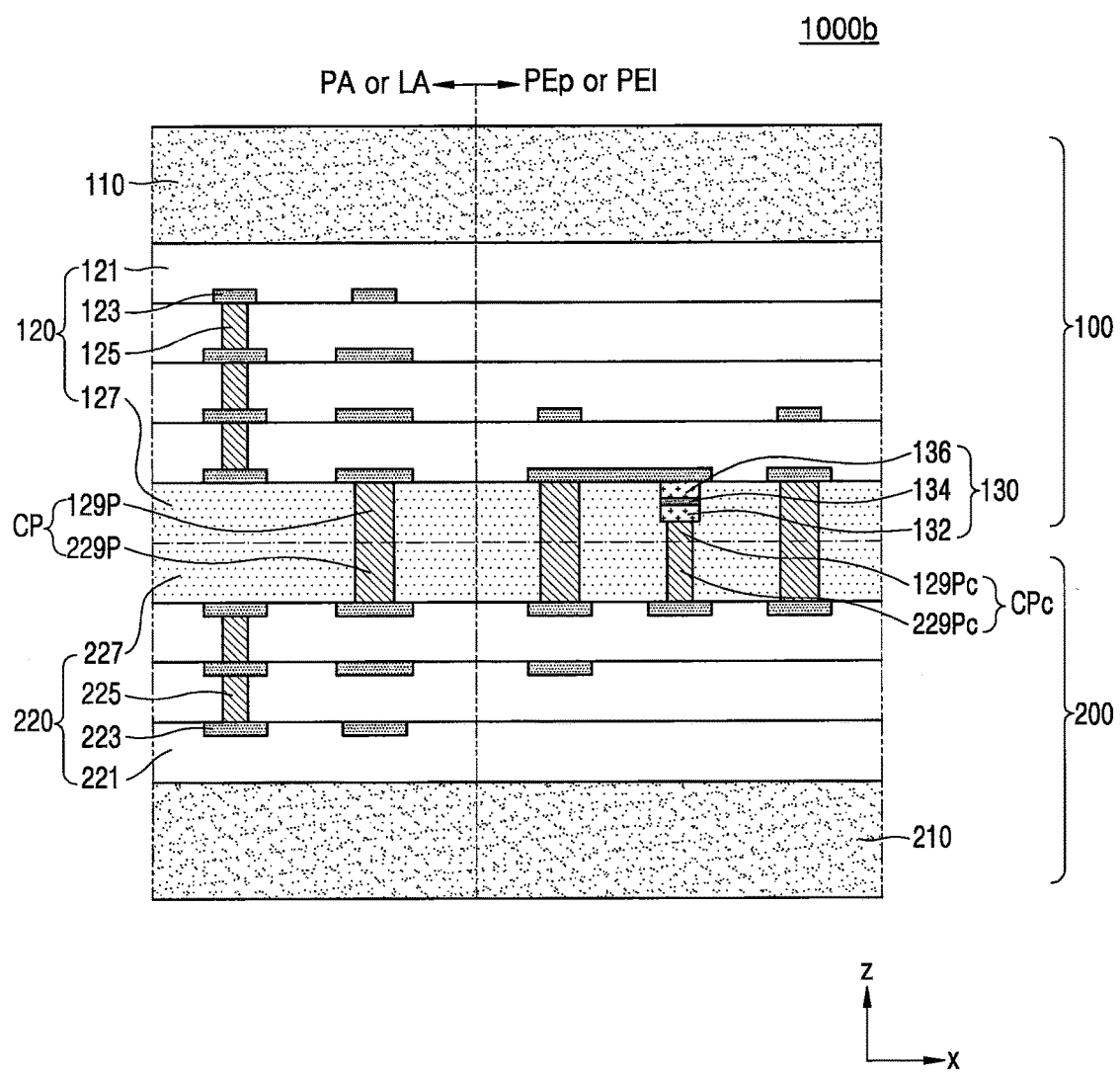

Referring to FIG. 3B, a structure for voltage application to an MIM capacitor 130 in the stacked CIS 1000b, according to some embodiments of the inventive concept, may be different from a structure for voltage application to the MIM capacitor 130 in the stacked CIS 1000 of FIG. 1B. In detail, in the stacked CIS 1000b, according to some embodiments of the inventive concept, a cap Cu pad CPc and a Cu pad CP adjacent thereto may be connected to each other through a first wiring line 123 of a first semiconductor chip 100, and, thus, a voltage may be applied to the MIM capacitor 130 through second wiring lines 223 of a second semiconductor chip 200. For example, voltages may be applied to both ends of the MIM capacitor 130 in such a manner that a negative voltage is applied to a second wiring line 223 connected to the cap Cu pad CPc and a positive voltage is applied to another second wiring line 223 connected to the Cu pad CP.

In the stacked CIS 1000b according to some embodiments of the inventive concept, the Cu pad CP and the cap Cu pad CPc may be formed as single Damascene structures. However, embodiments of the inventive concept are not limited thereto, and the Cu pad CP and the cap Cu pad CPc may be formed as dual Damascene structure in other embodiments of the inventive concept.

Figure 3C:
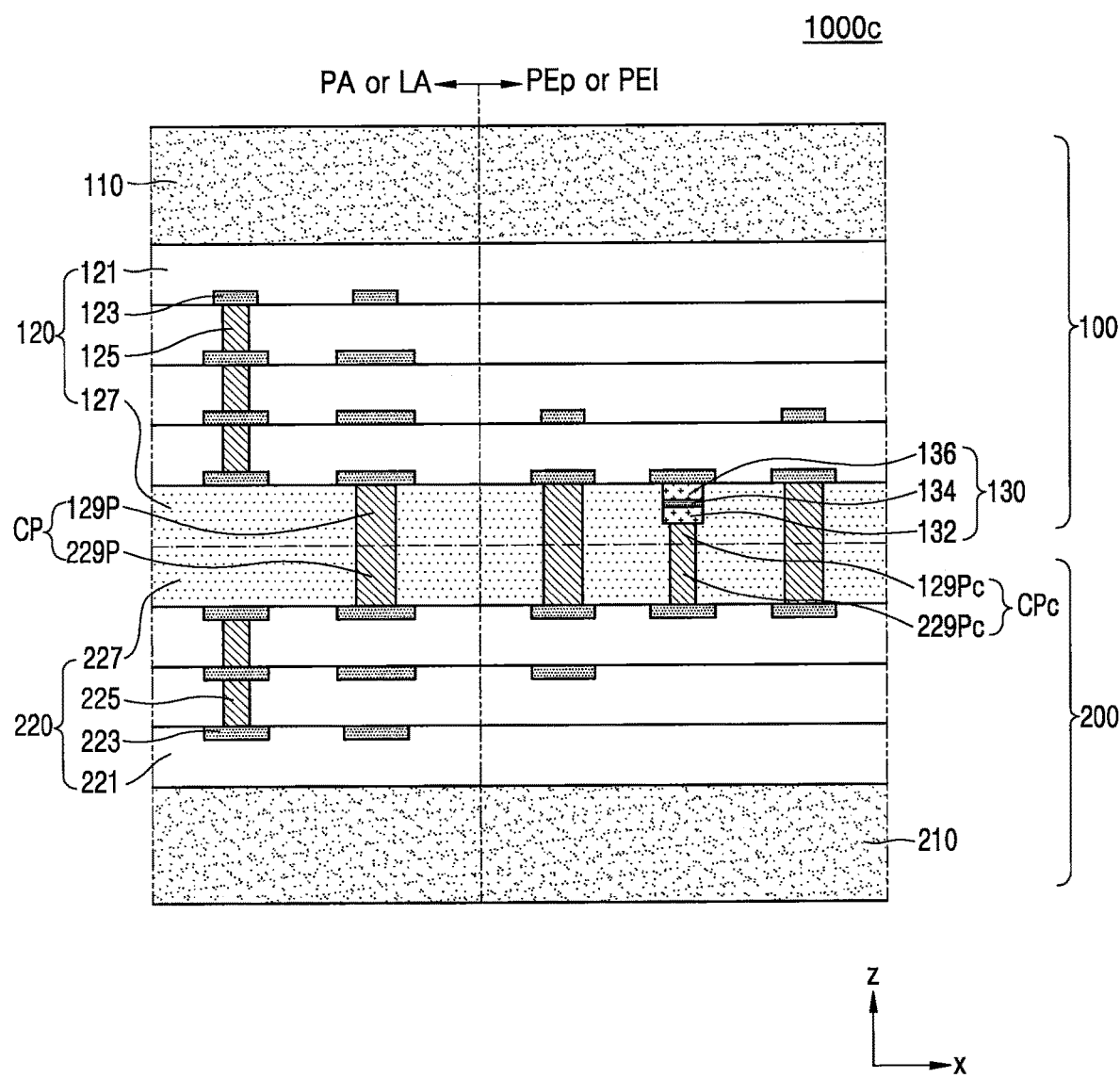

Referring to FIG. 3C, a structure for voltage application to a MIM capacitor 130 in the stacked CIS 1000c, according to some embodiments of the inventive concept, may be different from a structure for voltage application to the MIM capacitor 130 in the stacked CIS 1000 of FIG. 1B. Specifically, in the stacked CIS 1000c, according to some embodiments of the inventive concept, an upper portion of the MIM capacitor 130 may be connected to a first wiring line 123 and a lower portion of the MIM capacitor 130 may be connected to a second wiring line 223 through a cap Cu pad CPc. Voltages may be applied to the MIM capacitor 130 through the first wiring line 123 of a first semiconductor chip 100 and the second wiring line 223 of a second semiconductor chip 200. For example, voltages may be applied to both ends of the MIM capacitor 130 in such a manner that a positive voltage is applied to the first wiring line 123 connected to the MIM capacitor 130 and a negative voltage is applied to the second wiring line 223 connected to the cap Cu pad CPc. Also in the stacked CIS 1000c, according to some embodiments of the inventive concept, a Cu pad CP and the cap Cu pad CPc may be formed as a dual Damascene structure instead of a single Damascene structure.

Although several embodiments have been illustrated above for structures for voltage application to a MIM capacitor 130, embodiments of structures for voltage application to the MIM capacitor 130 are not limited thereto. For example, various structures for voltage application to the MIM capacitor 130 may be implemented through various combinations of the first wiring lines 123, the second wiring lines 223, the Cu pad CP, and the cap Cu pad CPc in accordance with various embodiments of the inventive concept.

Figure 3D:
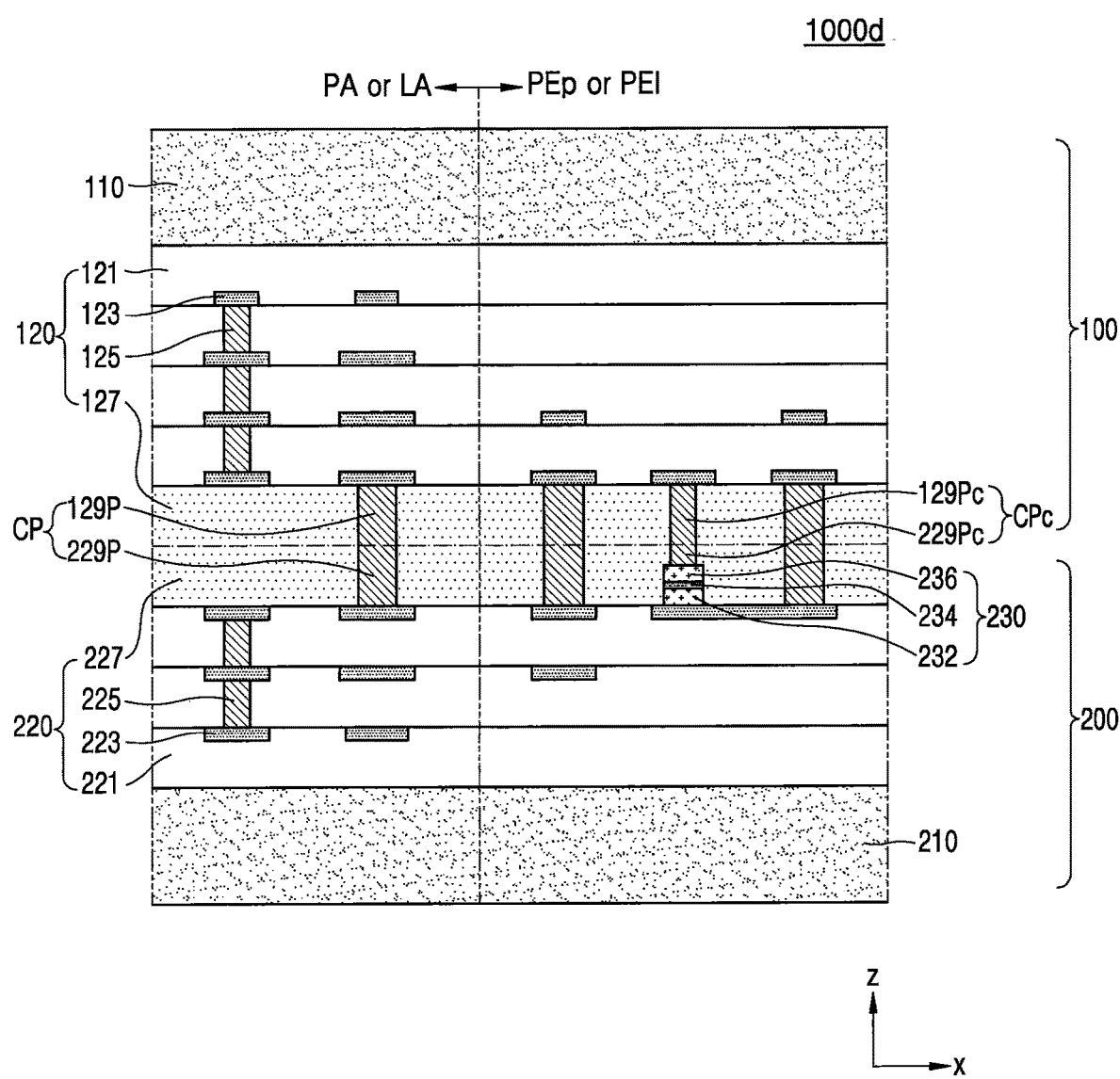

Referring to FIG. 3D, the position of an MIM capacitor 230 in the stacked CIS 1000d, according to some embodiments of the inventive concept, may be different from the position of the MIM capacitor 130 in the stacked CIS 1000 of FIG. 1B. Specifically, in the stacked CIS 1000d, according to some embodiments of the inventive concept, the MIM capacitor 230 may be arranged in a second pad insulating layer 227. Also, the MIM capacitor 230 may be arranged between a cap Cu pad CPc on the MIM capacitor 230 and a second wiring line 223 under the MIM capacitor 230 and electrically connected to an adjacent Cu pad CP through the second wiring line 223. Also in the stacked CIS 1000d, according to some embodiments of the inventive concept, the Cu pad CP and the cap Cu pad CPc may be formed as a dual Damascene structure instead of a single Damascene structure.

Figure 4A:
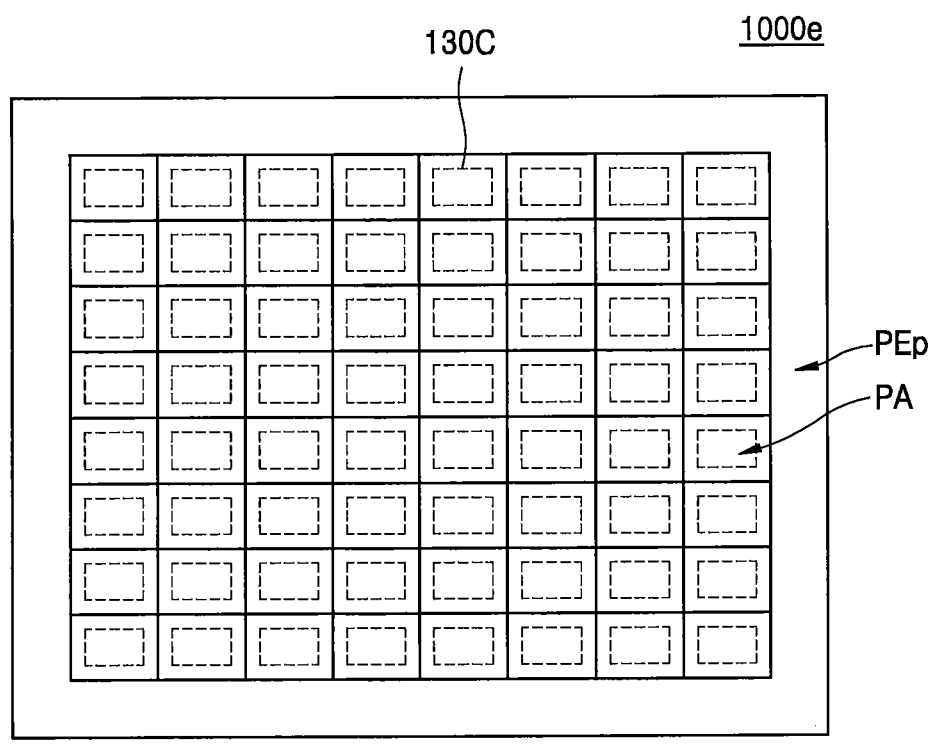
FIGS. 4A and 4B are plan views of stacked CISs according to some embodiments of the inventive concept.
Figure 4B:
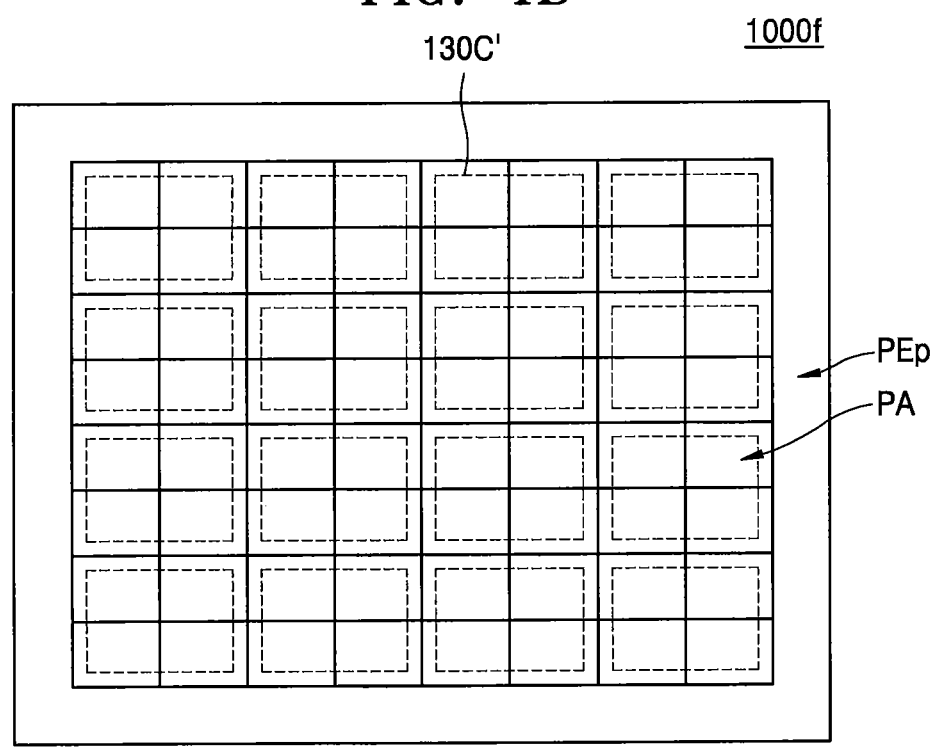
Figure 4C:
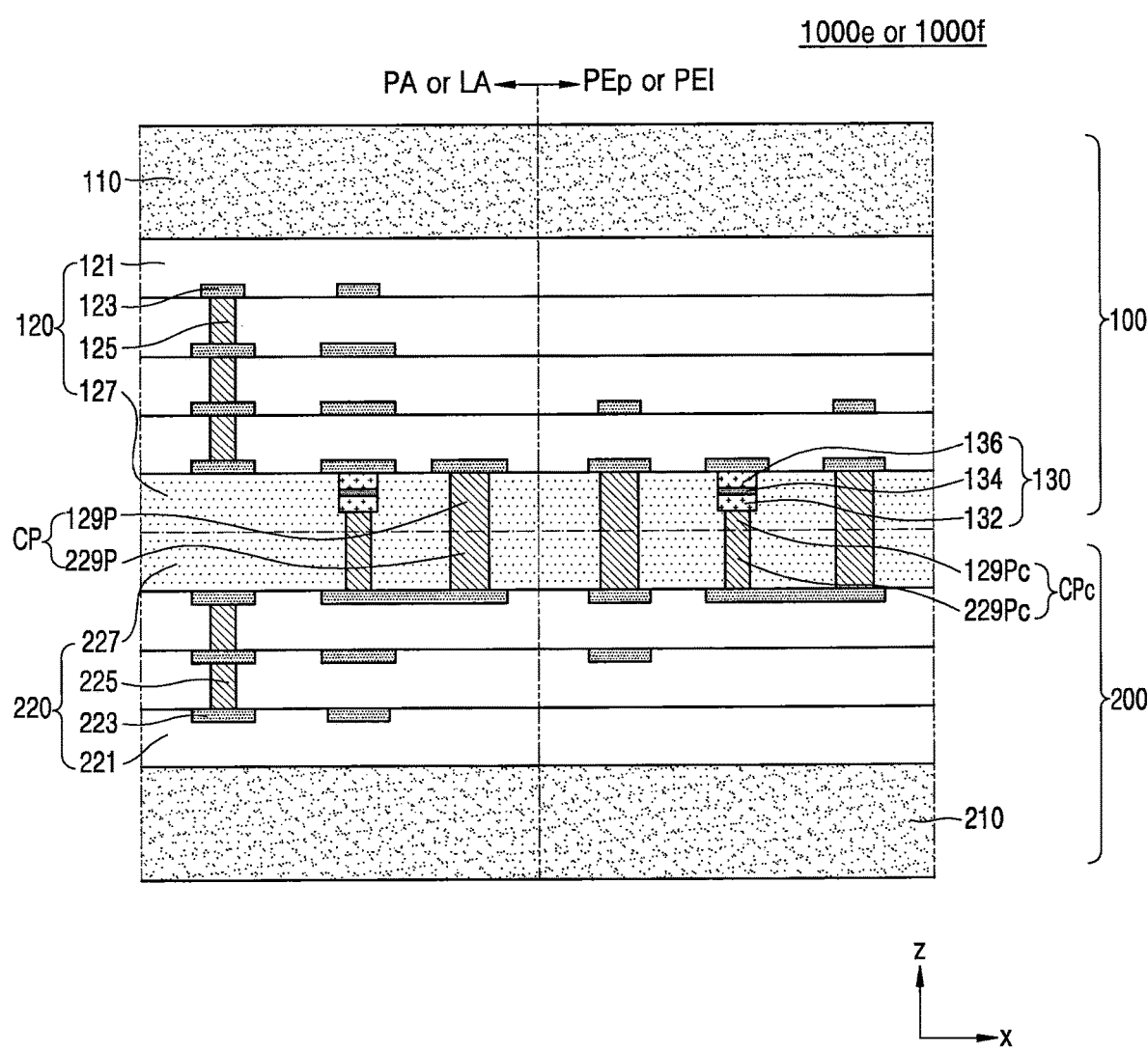
FIG. 4C is a cross-sectional view of any one of the stacked CISs of FIGS. 4A and 4B.

FIGS. 4A and 4B are plan views of stacked CISs 1000e and 1000f according to some embodiments of the inventive concept, and FIG. 4C is a cross-sectional view of the stacked CIS 1000e or 1000f. The cross-sectional view of FIG. 4C corresponds to the cross-sectional view of FIG. 1B. The elements already described in the description of FIGS. 1A to 3D are briefly described or omitted.

Referring to FIGS. 4A to 4C, the positions of MIM capacitors 130C and 130C' in the stacked CISs 1000e and 1000f, according to some embodiments of the inventive concept, may be different from the position of the MIM capacitor 130 in the stacked CIS 1000 of FIG. 1B. Specifically, in the stacked CISs 1000e and 1000f according to some embodiments of the inventive concept, the MIM capacitors 130C and 130C' may be arranged in a pixel area PA. In addition, the MIM capacitors 130C and 130C' may be arranged in various structures in the pixel area PA.

For example, as shown in FIG. 4A, one MIM capacitor 130C may be arranged in each pixel of the pixel area PA. In addition, as shown in FIG. 4B, four pixels may constitute one group and one MIM capacitor 130C' may be arranged in each group in the pixel area PA. In this case, a pixel may be conceptualized to include a shared pixel. Thus, when a pixel is a shared pixel that includes four diodes, one group may include sixteen diodes. A group is not limited to four pixels, but may be variously set according to various embodiments of the inventive concept. For example, one group may be set to two pixels or eight pixels. In addition, the arrangement per pixel of the MIM capacitors 130C and 130C' or the arrangement per group of the MIM capacitors 130C and 130C' may correspond to a functional meaning by electrical connection rather than a spatial meaning.

Although a Cu pad CP and a cap Cu pad CPc, which have a single Damascene structure are shown in FIG. 4C, the Cu pad CP and the cap Cu pad CPc may be formed as a dual Damascene structure in other embodiments of the inventive concept. In addition, structures for voltage application to the MIM capacitors 130C and 130C' may be variously implemented in accordance with some embodiments of the inventive concept. For example, a structure for voltage application, according to some embodiments of the inventive concept, may be implemented as a structure in which a voltage is applied through second wiring lines 223 as in the stacked CIS 1000b of FIG. 3B or is applied through a first wiring line 123 and a second wiring line 223 as in the stacked CIS 1000c of FIG. 3C.

In the stacked CISs 1000e and 1000f according to some embodiments of the inventive concept, although the MIM capacitors 130C and 130C' are arranged only in a pixel area PA of a first semiconductor chip 100, the arrangement positions of the MIM capacitors 130C and 130C' are not limited thereto in other embodiments of the inventive concept. For example, the MIM capacitors 130C and 130C' may be arranged in a logic area LA of a second semiconductor chip 200. That is, similar to the stacked CIS 1000d of FIG. 3D, the MIM capacitors 130C and 130C' may be arranged in a second pad insulating layer 227 of the logic area LA. Also, the MIM capacitors 130C and 130C' may be formed in both the pixel area PA and a pixel peripheral area PEp of the first semiconductor chip 100 or in the logic area LA and a logic peripheral area PEl of the second semiconductor chip 200. Furthermore, the MIM capacitors 130C and 130C' may be formed on each of the first semiconductor chip 100 and the second semiconductor chip 200.

Figure 5:
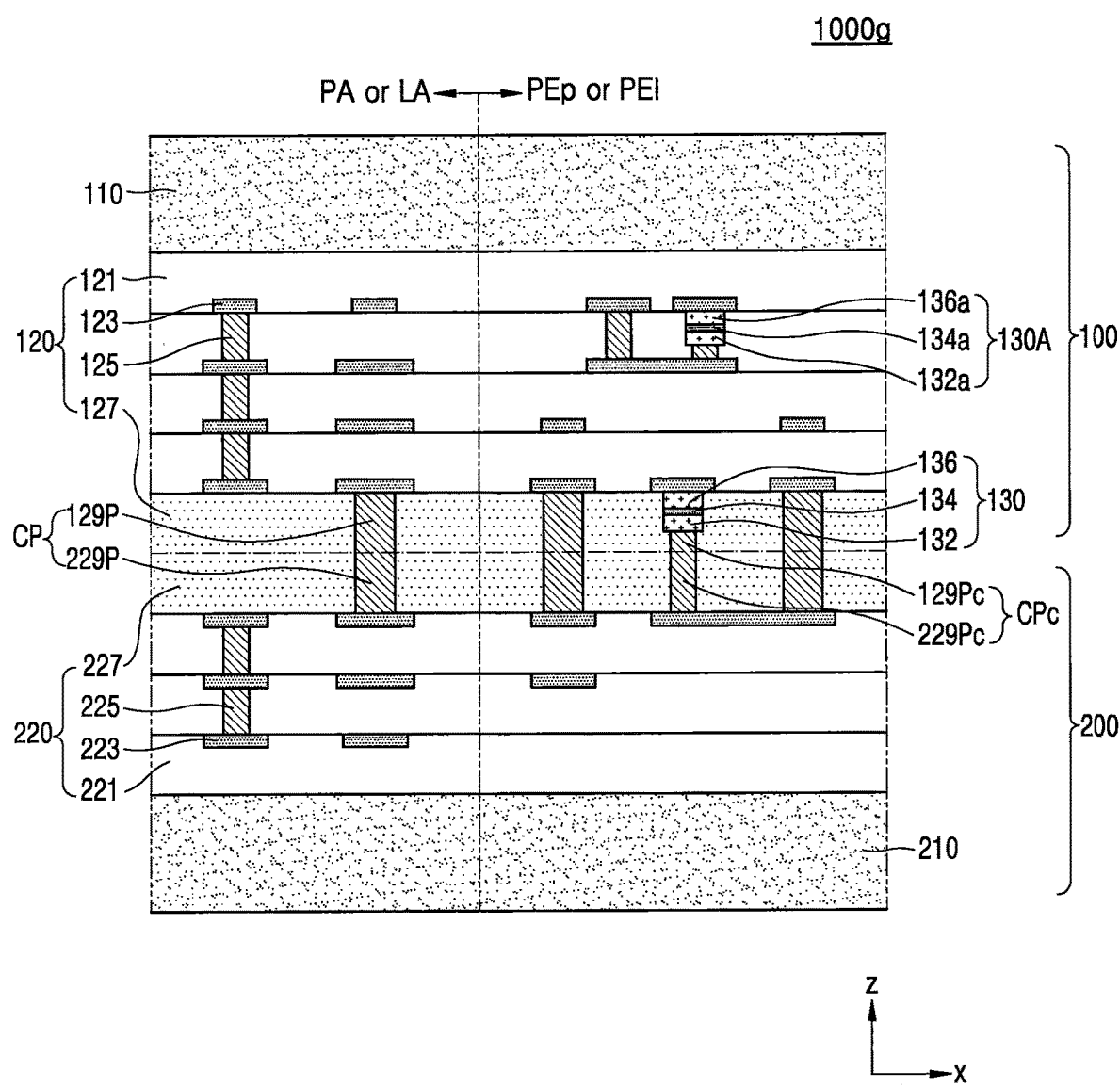
FIG. 5 is a cross-sectional view of a stacked CIS according to some embodiments of the inventive concept.

FIG. 5 is a cross-sectional view of a stacked CIS 1000g according to some embodiments of the inventive concept. The cross-sectional view of FIG. 5 corresponds to the cross-sectional view of FIG. 1B. The elements already described in the description of FIGS. 1A to 4C will be briefly described or omitted.

Referring to FIG. 5, the stacked CIS 1000g, according to some embodiments of the inventive concept, may be different from the stacked CIS 1000 of FIG. 1B in that the stacked CIS 1000g further includes an additional MIM capacitor 130A. More specifically, in the stacked CIS 1000g, according to some embodiments of the inventive concept, a MIM capacitor 130 may be formed in a first pad insulating layer 127 of a first semiconductor chip 100 and the additional MIM capacitor 130A may be formed in any one of first interlayer insulating layers 121 of a wiring layer 120 of the first semiconductor chip 100. The additional MIM capacitor 130A may be substantially the same as an MIM capacitor formed in an interlayer insulating layer of a conventional CIS.

In the stacked CIS 1000g, according to some embodiments of the inventive concept, although the additional MIM capacitor 130A is formed in a pixel peripheral area PEp of the first semiconductor chip 100, the arrangement position of the additional MIM capacitor 130A is not limited thereto. For example, the additional MIM capacitor 130A may be formed in any one of first interlayer insulating layers 121 of a pixel area PA of the first semiconductor chip 100. Furthermore, the additional MIM capacitors may be formed in any one of second interlayer insulating layers 221 of a logic area LA and/or a logic peripheral area PE1 of a second semiconductor chip 200.

Figure 6A:
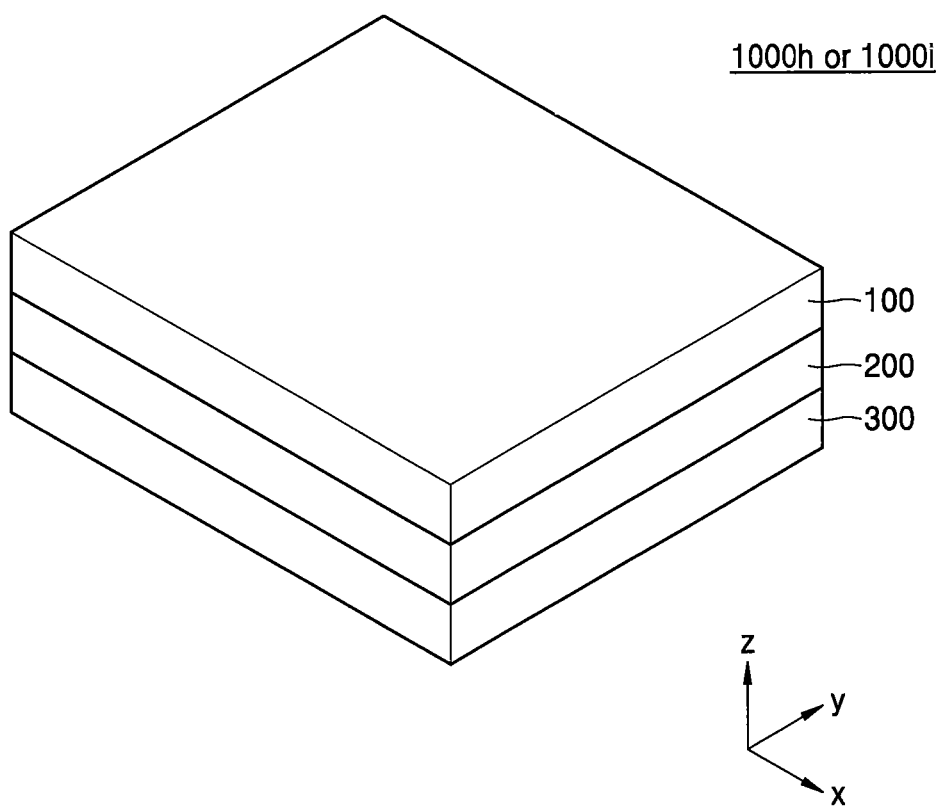
FIG. 6A is a perspective view of a stacked CIS according to some embodiments of the inventive concept.
Figure 6B:
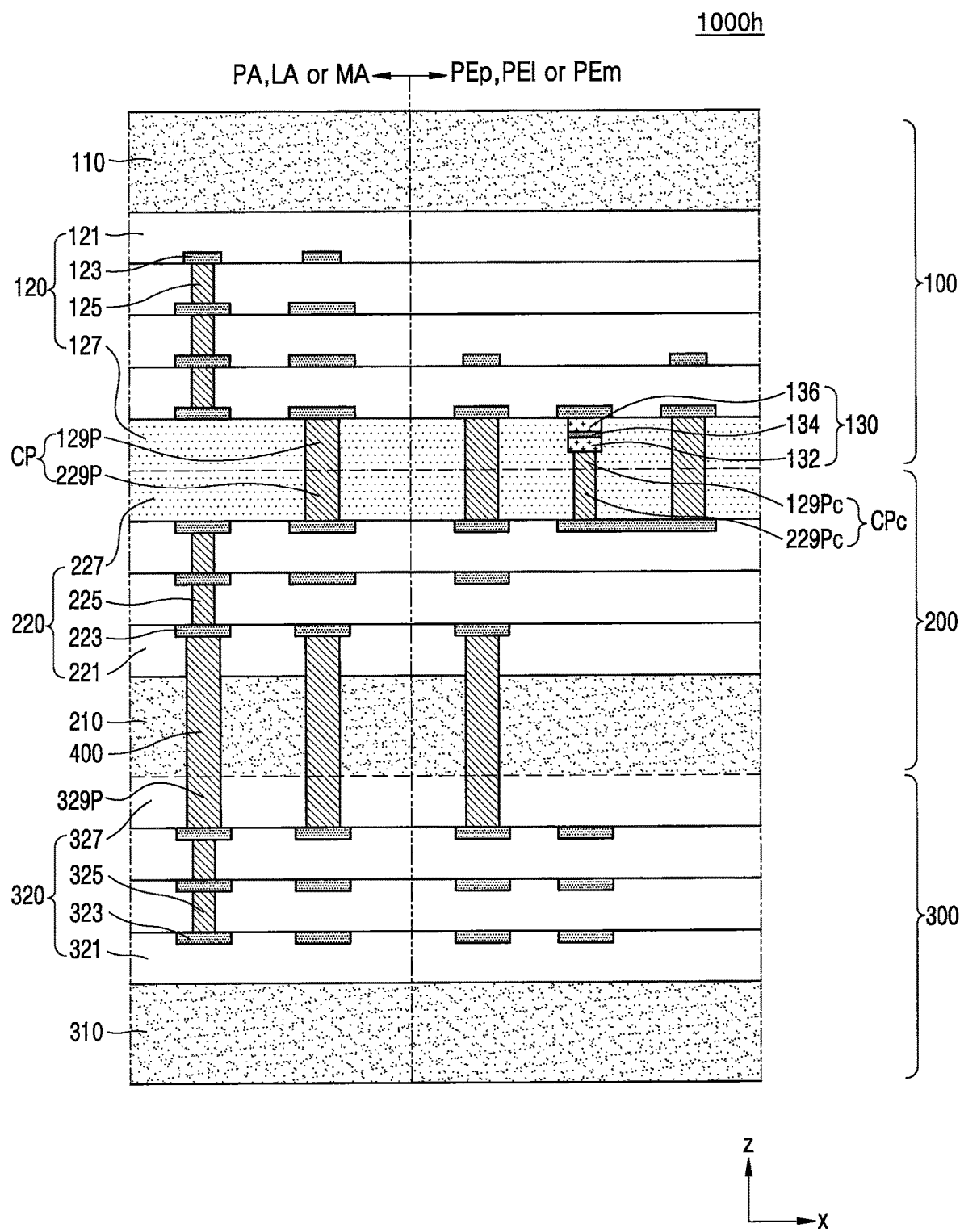
FIGS. 6B and 6C are cross-sectional views of the stacked CIS of FIG. 6A.
Figure 6C:
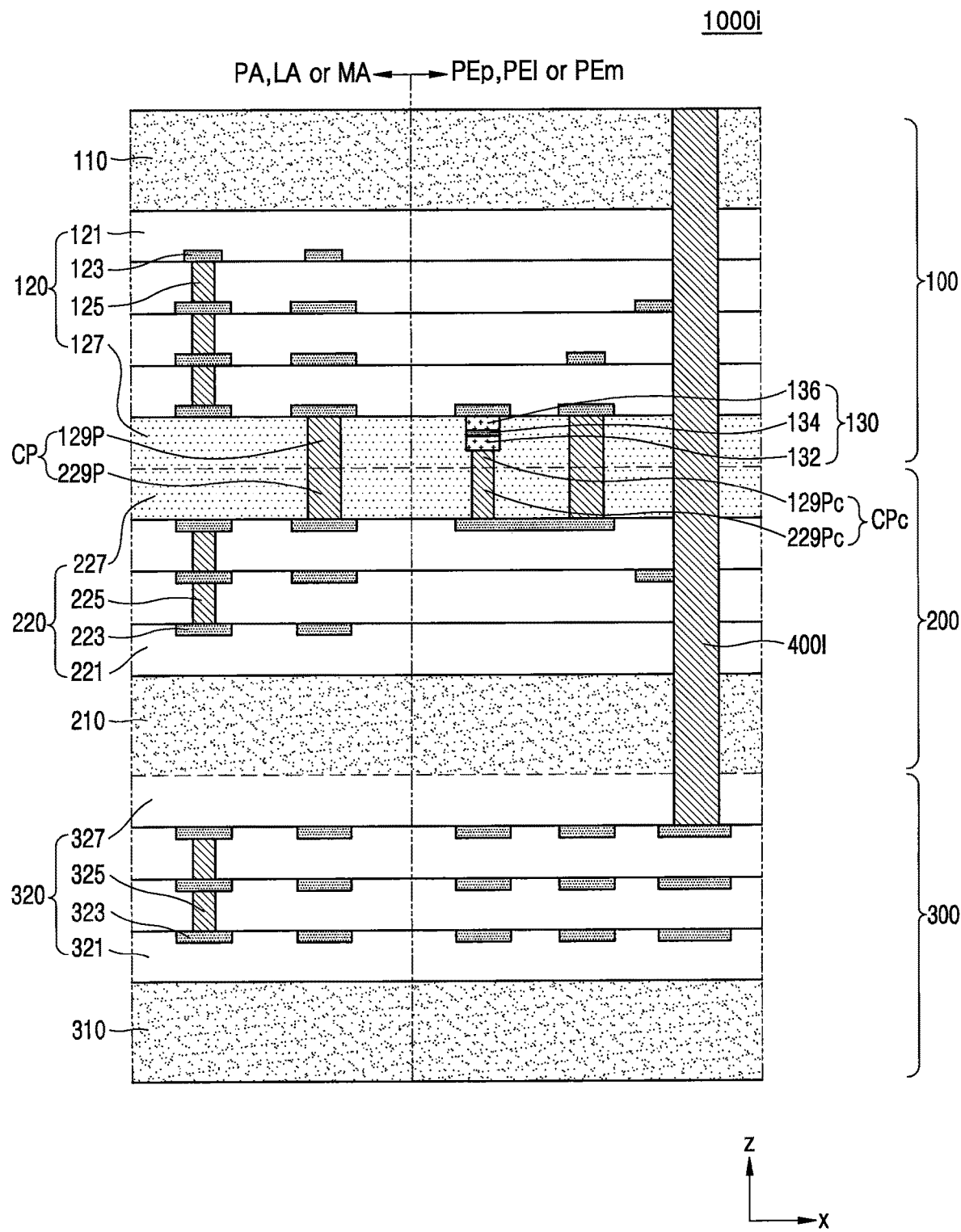

FIG. 6A is a perspective view of a stacked CIS 1000h or 1000i according to some embodiments of the inventive concept, and FIGS. 6B and 6C are cross-sectional views of the stacked CIS 1000h and the stacked CIS 1000i, respectively. The cross-sectional views of FIGS. 6B and 6C correspond to the cross-sectional view of FIG. 1B. The elements already described in the description of FIGS. 1A to 5 will be briefly described or omitted.

Referring to 6A to 6C, the stacked CISs 1000h and 1000i, according to some embodiments of the inventive concept, may be different from the stacked CIS 1000 of FIG. 1B in that each of the stacked CISs 1000h and 1000i has a structure in which three semiconductor chips 100, 200, and 300 are stacked. Specifically, each of the stacked CISs 1000h and 1000i, according to some embodiments of the inventive concept, may include a first semiconductor chip 100 in which pixels are arranged, a second semiconductor chip 200 in which logic elements are arranged, and a third semiconductor chip 300 in which memory elements are arranged.

As described above, in the stacked CIS 1000 of FIG. 1A, the second semiconductor chip 200 may include a memory area and memory elements may be arranged in the memory area. In the stacked CISs 1000h and 1000i, according to some embodiments of the inventive concept, memory elements may be arranged in the third semiconductor chip 300 and the third semiconductor chip 300 may be coupled to the second semiconductor chip 200. The memory elements may be DRAM and/or MRAM, as described above, and may be arranged in a two-dimensional array structure in a memory cell area MA of the third semiconductor chip 300. The memory elements may be used as an image buffer memory for storing a frame image. The third semiconductor chip 300 may include a memory peripheral area PEm outside the memory cell area MA.

As shown in FIG. 6B, a coupling structure of the first semiconductor chip 100 and the second semiconductor chip 200 and an arrangement structure of an MIM capacitors 130 in a first pad insulating layer 127 are the same as those described in the stacked CIS 1000 of FIG. 1B. However, embodiments of the coupling structure of the first semiconductor chip 100 and the second semiconductor chip 200 and the arrangement structure of the MIM capacitors 130 in the first pad insulating layer 127 are not limited thereto. For example, in the stacked CISs 1000h and 1000i according to some embodiments of the inventive concept, the MIM capacitor 130 may be arranged in any one of the arrangement structures of the MIM capacitors 130 and 230 in the stacked CISs 100a to 100g of FIGS. 3A to 3D, 4C, and 5.

A third semiconductor substrate 310 may be positioned in the lower portion of the third semiconductor chip 300 in a third direction (z direction) and a third wiring layer 320 may be positioned in the upper portion of the third semiconductor chip 300 in the third direction (z direction). Transistors for memory elements may be arranged in the third semiconductor substrate 310. The third wiring layer 320 may include third interlayer insulating layers 321, third wiring lines 323, third vertical contacts 325, and a third pad insulating layer 327.

In the stacked CISs 1000h and 1000i according to some embodiments of the inventive concept, the first semiconductor chip 100 may be coupled to the upper portion of the second semiconductor chip 200 in the third direction (z direction) and the third semiconductor chip 300 may be coupled to the lower portion of the second semiconductor chip 200. Specifically, the first semiconductor chip 100 and the second semiconductor chip 200 may be coupled to each other, such that the lower surface of a first wiring layer 120 of the first semiconductor chip 100 faces the upper surface of a second wiring layer 220 of the second semiconductor chip 200, and the second semiconductor chip 200 and the third semiconductor chip 300 may be coupled to each other such that the lower surface of a second semiconductor substrate 210 of the second semiconductor chip 200 faces the upper surface of a third wiring layer 320 of the third semiconductor chip 300.

The electrical connection between the first semiconductor chip 100 and the second semiconductor chip 200 may be made through Cu—Cu bonding, that is, a Cu pad CP, as described above. The electrical connection between the second semiconductor chip 200 and the third semiconductor chip 300 may be made through a penetrating electrode 400 shown in FIG. 6B or a penetrating electrode 4001 shown in FIG. 6C. That is, in the stacked CIS 1000h, the second semiconductor chip 200 and the third semiconductor chip 300 may be electrically connected to each other through the penetrating electrode 400, and in the stacked CIS 1000i, the second semiconductor chip 200 and the third semiconductor chip 300 may be electrically connected to each other through the penetrating electrode 4001.

First, as shown in the stacked CIS 1000h of FIG. 6B, the second semiconductor chip 200 and the third semiconductor chip 300 may be connected to each other by a combination of the penetrating electrode 400 and a third Cu pad 329P. For example, the penetrating electrode 400 may be connected to second wiring lines 223 of the second wiring layer 220 of the second semiconductor chip 200, and may be connected to the third wiring line 323 of the third wiring layer 320 of the third semiconductor chip 300 through the third Cu pad 329P. Because the penetrating electrode 400 penetrates a silicon substrate, i.e., the second semiconductor substrate 210 of the second semiconductor chip 200, the penetrating electrode 400 may be referred to as a through silicon via (TSV).

Next, as shown in the stacked CIS 1000i of FIG. 6C, the second semiconductor chip 200 and the third semiconductor chip 300 may be electrically connected to each other through one integrated penetrating electrode, i.e., the penetrating electrode 4001. The penetrating electrode 4001 may be connected to the third wiring line 323 of the third wiring layer 320 of the third semiconductor chip 300 through the first semiconductor chip 100 and the second semiconductor chip 200. The penetrating electrode 4001 may also be connected to the first wiring line 123 of the first wiring layer 120 of the first semiconductor chip 100 and the second wiring line 223 of the second wiring layer 220 of the second semiconductor chip 200. The penetrating electrode 4001 may be implemented through a TSV process in a pixel peripheral area PEp of the first semiconductor chip 100 after the first semiconductor chip 100, the second semiconductor chip 200, and the third semiconductor chip 300 are coupled together. For example, the penetration electrode 4001 may be implemented by performing a TSV process, such that the first semiconductor chip 100 and the second semiconductor chip 200 are completely penetrated and an upper part of the third semiconductor chip 300 is penetrated.

Because the penetrating electrode 4001 completely penetrates the first semiconductor chip 100 and the second semiconductor chip 200, the penetrating electrode 4001 may be formed only in peripheral areas, i.e., the pixel peripheral area PEp, a logic peripheral area PEl, and a memory peripheral area PEm, to reduce or prevent damage to pixels of the first semiconductor chip 100 and/or logic elements of the second semiconductor chip 200. For reference, because the penetrating electrode 400 of FIG. 6B penetrates only the second semiconductor substrate 210 of the second semiconductor chip 200, the penetrating electrode 400 may be formed in a logic area LA as well as the logic peripheral area PE1 of the second semiconductor chip 200.

In addition, in the stacked CISs 1000*h* and 1000*i* of FIGS. 6B and 6C, as described above for the stacked CIS 1000 of FIG. 1B, the coupling of the first semiconductor chip 100 and the second semiconductor chip 200 through a Cu—Cu bonding process may be performed at a wafer level and the coupling of the second semiconductor chip 200 and the third semiconductor chip 300 through the penetrating electrode 400 and the third Cu pad 329 may also be performed at the wafer level. For example, a first wafer including first semiconductor chips 100, a second wafer including second semiconductor chips 200, and a third wafer including third semiconductor chips 300 may be coupled to each other and then separated into a plurality of stacked chip structures through a sawing process or the like. Each of the plurality of stacked chip structures may have a three-layer structure including a first semiconductor chip 100, a second semiconductor chip 200, and a third semiconductor chip 300.

Figure 7A:
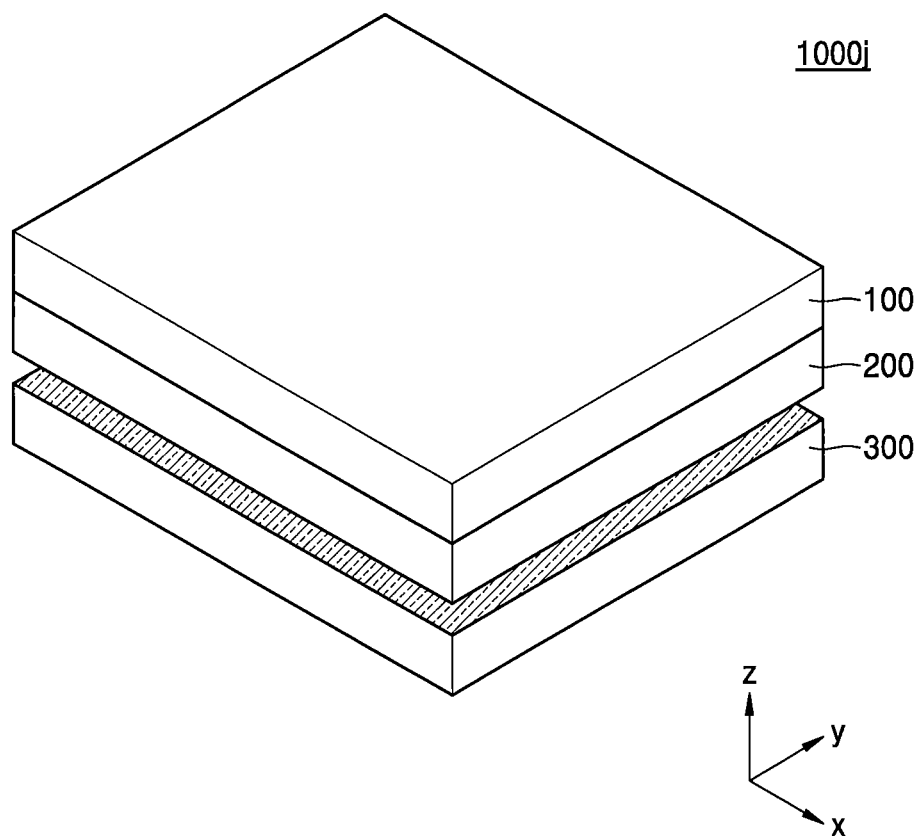
FIGS. 7A and 7B are a perspective view and a cross-sectional view, respectively, of a stacked CIS according to some embodiments of the inventive concept.
Figure 7B:
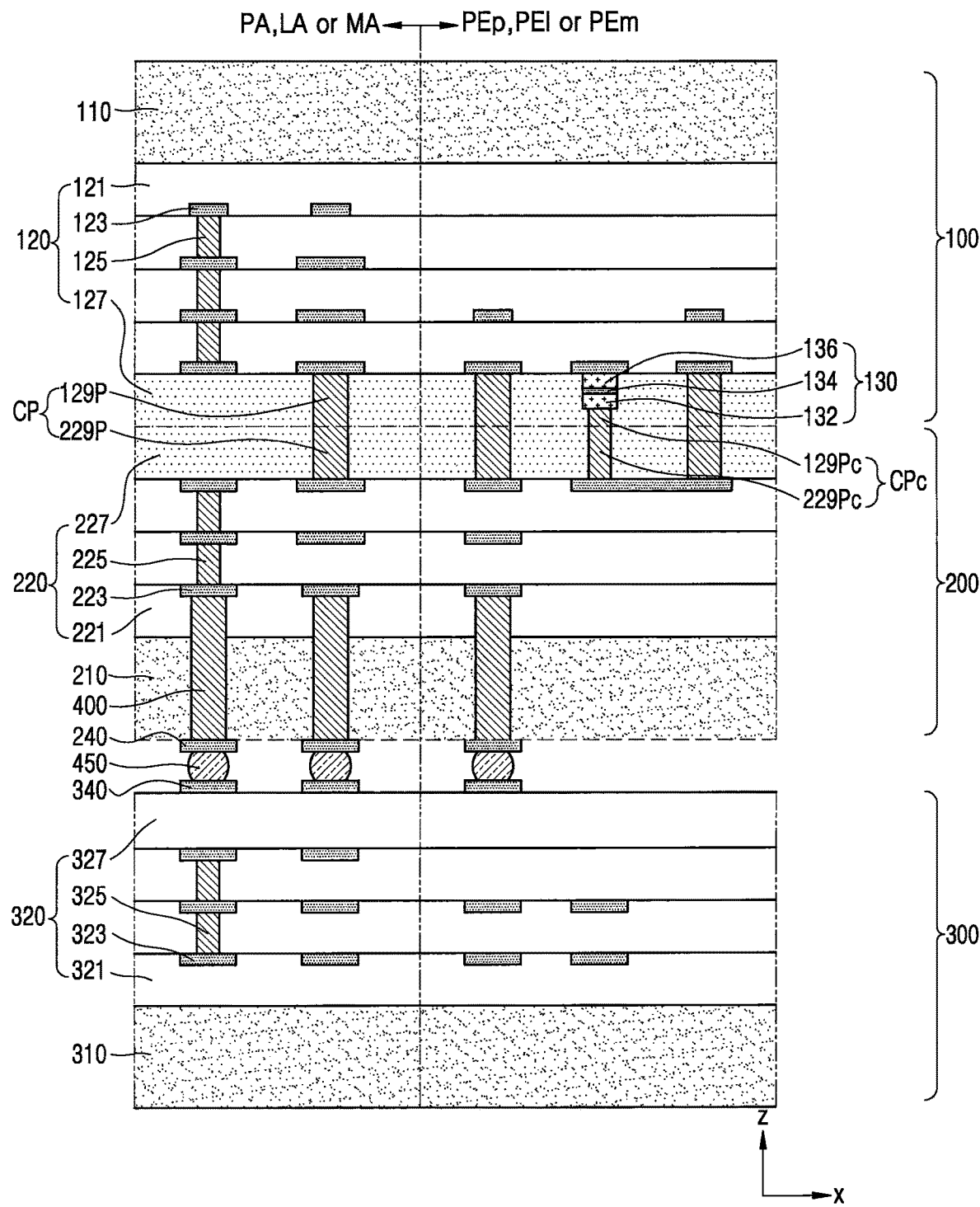

FIGS. 7A and 7B are a perspective view and a cross-sectional view, respectively, of a stacked CIS 1000*j* according to some embodiments of the inventive concept, and the cross-sectional view of FIG. 7B corresponds to the cross-sectional view of FIG. 1B. The elements already described in the description of FIGS. 1A to 6B will be briefly described or omitted.

Referring to FIGS. 7A and 7B, the stacked CIS 1000*j*, according to some embodiments of the inventive concept, may be different from the stacked CIS 1000*h* of FIG. 6B in terms of a structure in which a third semiconductor chip 300 is coupled to a second semiconductor chip 200. Specifically, in the stacked CIS 1000*j* according to some embodiments of the inventive concept, the second semiconductor chip 200 and the third semiconductor chip 300 may be coupled to each other via an external connection terminal 450. For example, a penetrating electrode 400 connected to a second wiring line 223 of a second wiring layer 220 through a second semiconductor substrate 210 may be formed in the second semiconductor chip 200. In addition, an electrode pad 240 may be formed on the lower surface of the penetrating electrode 400. A chip pad 340 may be formed on the upper surface of the third semiconductor chip 300. The chip pad 340 may be electrically connected to a third wiring line 323 of a third wiring layer 320. The external connection terminal 450 such as a solder ball or a bump may be arranged between the electrode pad 240 and the chip pad 340, and thus, the second semiconductor chip 200 and the third semiconductor chip 300 may be coupled and electrically connected to each other. That is, second wiring lines 223 of the second semiconductor chip 200 may be electrically connected to third wiring lines 323 of the third semiconductor chip 300 through the penetrating electrode 400 and the external connection terminal 450.

Also in the stacked CIS 1000*j* according to some embodiments of the inventive concept, the coupling of the first semiconductor chip 100 and the second semiconductor chip 200 through a Cu—Cu bonding process may be performed at a wafer level, and the coupling of the second semiconductor chip 200 and the third semiconductor chip 300 through the external connection terminals 450 may also be performed at the wafer level. For example, after three wafers, i.e., a first wafer including first semiconductor chips 100, a second wafer including second semiconductor chips 200, and a third wafer including third semiconductor chips 300, may be coupled to each other at a wafer level and then separated into a plurality of stacked chip structures having a three-layer structure through a sawing process or the like.

Figure 8:
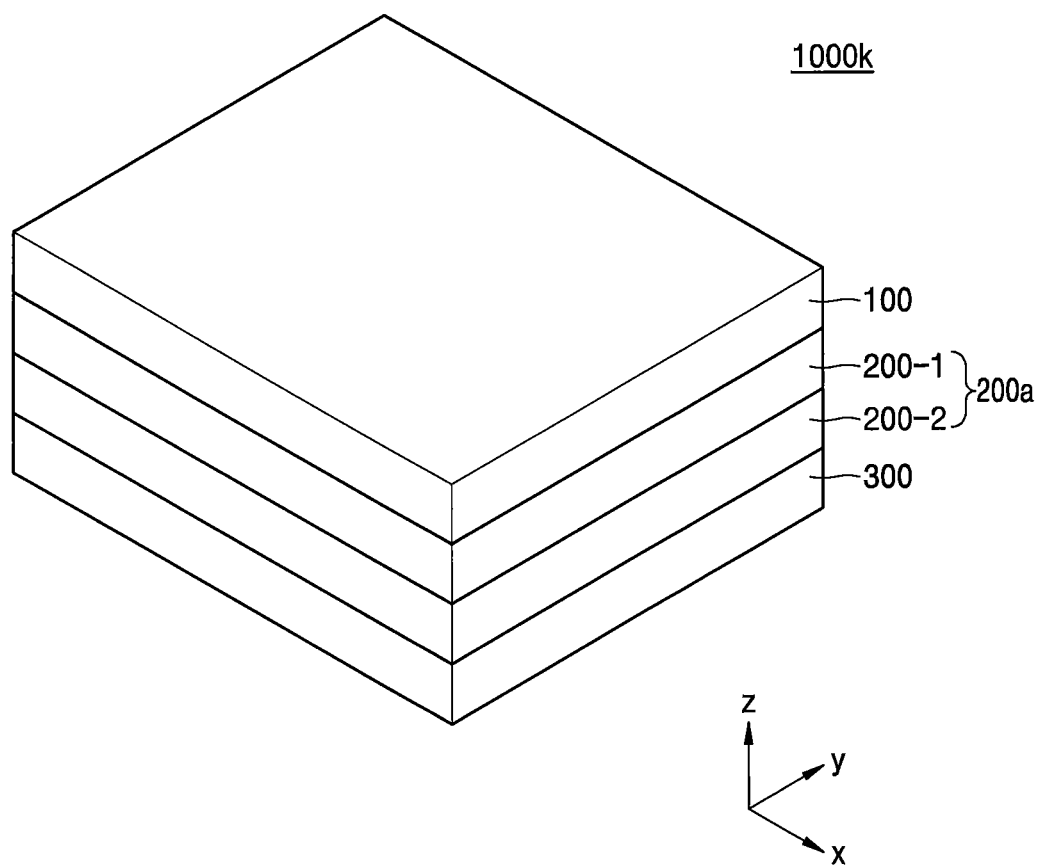
FIG. 8 is a perspective view of a stacked CIS according to some embodiments of the inventive concept.

FIG. 8 is a perspective view of a stacked CIS 1000*k* according to some embodiments of the inventive concept. The elements already described in the description of FIGS. 1A to 7B will be briefly described or omitted.

Referring to FIG. 8, the stacked CIS 1000*k*, according to some embodiments of the inventive concept, may be different from the stacked CISs 1000*h* and 1000*i* of FIG. 6A in that the stacked CIS 1000*k* has a structure in which four semiconductor chips 100, 200-1, 200-2 and 300 are stacked. Specifically, the stacked CIS 1000*k*, according to some embodiments of the inventive concept, may include a first semiconductor chip 100 in which pixels are arranged, upper and lower second semiconductor chips 200-1 and 200-2 in which logic elements are arranged, and a third semiconductor chip 300 in which memory elements are arranged. A second semiconductor chip 200*a* including the upper second semiconductor chip 200-1 and the lower second semiconductor chip 200-2 may correspond to the second semiconductor chip 200 in the stacked CIS 1000 of FIG. 1A. For example, the upper second semiconductor chip 200-1 may include an ADC circuit, and the lower second semiconductor chip 200-2 may include various signal processing circuits other than or in addition to an ADC circuit.

Cu—Cu bonding may be performed between the first semiconductor chip 100 and the upper second semiconductor chip 200-1. A MIM capacitor (see the MIM capacitor 130 in FIG. 1B) may be arranged in a first pad insulating layer (see the first pad insulating layer in FIG. 1B) of the first semiconductor chip 100 in which the Cu—Cu bonding is performed. Also, the MIM capacitor may be arranged in a pad insulating layer of the upper second semiconductor chip 200-1. The coupling of the upper and lower second semiconductor chips 200-1 and 200-2 and the coupling of the lower second semiconductor chip 200-2 and the third semiconductor chip 300 may be implemented using any one of various coupling schemes, such as Cu—Cu bonding, coupling of a penetrating electrode and a Cu pad, coupling of a penetrating electrode and an external connection terminal, and coupling through an integrated penetrating electrode in accordance with various embodiments of the inventive concept.

While the inventive concept has been particularly shown and described with reference to embodiments thereof, it will be understood that various changes in form and details may be made therein without departing from the spirit and scope of the following claims.

What is claimed is:

1. A stacked complementary metal oxide semiconductor (CMOS) image sensor comprising:
   a first semiconductor chip in which a plurality of pixels are in an upper area of the first semiconductor chip in a two-dimensional array structure and a first wiring layer is in a lower area of the first semiconductor chip; and
   a second semiconductor chip in which a second wiring layer is in an upper area of the second semiconductor chip and logic elements are in a lower area of the second semiconductor chip,
   wherein the first semiconductor chip is coupled to the second semiconductor chip through a connection between a first metal pad in a first pad insulating layer in a lowermost portion of the first wiring layer and a second metal pad in a second pad insulating layer in an uppermost portion of the second wiring layer, and wherein a metal-insulator-metal (MIM) capacitor is in the first pad insulating layer.

2. The stacked CMOS image sensor of claim 1, wherein the MIM capacitor is electrically connected to at least one of the first metal pad and the second metal pad.

3. The stacked CMOS image sensor of claim 1, wherein the MIM capacitor is in the first pad insulating layer, and the MIM capacitor is in a pixel peripheral area surrounding the pixel area.

4. The stacked CMOS image sensor of claim 1, wherein at least one of the first metal pad and the second metal pad is formed as a single damascene structure.

5. The stacked CMOS image sensor of claim 1, wherein at least one of the first metal pad and the second metal pad is formed as a dual damascene structure.

6. The stacked CMOS image sensor of claim 1, further comprising a third semiconductor chip including memory elements and a fourth semiconductor chip including an analog-to-digital converter (ADC) circuit.

7. The stacked CMOS image sensor of claim 6, wherein at least one of the third semiconductor chip and the fourth semiconductor chip is coupled to the second semiconductor chip and is electrically connected to the second semiconductor chip through a penetrating electrode.

8. The stacked CMOS image sensor of claim 1, wherein an additional MIM capacitor is in the first pad insulating layer.

9. The stacked CMOS image sensor of claim 1, wherein the first metal pad and the second metal pad comprise copper (Cu).

10. A stacked complementary metal oxide semiconductor (CMOS) image sensor comprising:
  a pixel chip including a pixel area containing a plurality of pixels and a pixel peripheral area surrounding the pixel area; and
  a logic chip under the pixel chip, the logic chip comprising logic elements,
  wherein the pixel chip and the logic chip are coupled to each other through copper (Cu)—Cu bonding,
  wherein a metal-insulator-metal (MIM) capacitor is in of a first insulating layer comprising a first Cu pad of the pixel chip, the logic chip further comprising a second insulating layer comprising a second Cu pad, the first Cu pad and the second Cu pad being used for the Cu—Cu bonding.

11. The stacked CMOS image sensor of claim 10, wherein the MIM capacitor is in the first insulating layer, and the MIM capacitor is in the pixel peripheral area.

12. The stacked CMOS image sensor of claim 10, wherein the first Cu pad and the second Cu pad, connected to the MIM capacitor, are respectively formed as a single damascene structure.

13. The stacked CMOS image sensor of claim 10, wherein an additional MIM capacitor is in the first insulating layer.

14. A stacked complementary metal oxide semiconductor (CMOS) image sensor comprising:
  a pixel chip comprising a pixel area containing a plurality of pixels and a pixel peripheral area surrounding the pixel area;
  a logic chip under the pixel chip, the logic chip comprising logic elements and a first insulating layer comprising a first metal pad; and
  a memory chip under the logic chip, the memory chip comprising memory elements,
  wherein the logic chip and the pixel chip are coupled to each other through metal-to-metal bonding,
  wherein a metal-insulator-metal (MIM) capacitor is in a second insulating layer comprising a second metal pad of the pixel chip, the first metal pad and the second metal pad being used for metal-to-metal bonding.

15. The stacked CMOS image sensor of claim 14, wherein the memory chip is electrically connected to the logic chip through a penetrating electrode.

16. The stacked CMOS image sensor of claim 14, wherein the logic chip comprises an upper logic chip and a lower logic chip, the upper logic chip comprising an analog-to-digital (ADC) circuit, and the lower logic chip comprising a signal processing circuit,
  wherein the metal-to-metal bonding is formed between the pixel chip and the upper logic chip.

* * * * *